United States Patent
Kanago et al.

(10) Patent No.: US 12,178,033 B2
(45) Date of Patent: Dec. 24, 2024

(54) MEMORY DEVICE INCLUDING CALIBRATION OPERATION AND TRANSISTOR HAVING ADJUSTABLE THRESHOLD VOLTAGE

(71) Applicant: Micron Technology, Inc., Boise, ID (US)

(72) Inventors: Anthony J. Kanago, Boise, ID (US); Jaydip Guha, Boise, ID (US); Srinivas Pulugurtha, Boise, ID (US); Soichi Sugiura, Bristow, VA (US)

(73) Assignee: Micron Technology, Inc., Boise, ID (US)

( * ) Notice: Subject to any disclaimer, the term of this patent is extended or adjusted under 35 U.S.C. 154(b) by 723 days.

(21) Appl. No.: 17/215,904

(22) Filed: Mar. 29, 2021

(65) Prior Publication Data

US 2022/0310620 A1    Sep. 29, 2022

(51) Int. Cl.
*G11C 11/40*        (2006.01)
*G11C 11/4096*      (2006.01)
(Continued)

(52) U.S. Cl.
CPC ........ H10B 12/315 (2023.02); G11C 11/4096 (2013.01); G11C 29/54 (2013.01);
(Continued)

(58) Field of Classification Search
CPC ............... G11C 11/4096; G11C 29/54; G11C 2029/0411; G11C 29/021; G11C 29/028; G11C 29/04; G11C 29/12; G11C 29/50004; G11C 29/52; G11C 29/4401; G11C 11/4085; G11C 11/4094; G11C 2207/2254; G11C 11/4074; G11C 11/4099;
(Continued)

(56) References Cited

U.S. PATENT DOCUMENTS

2007/0070683 A1* 3/2007 Fuhrmann ............ G11C 29/028
                                                         365/149
2010/0182859 A1* 7/2010 Kohler ..................... G11C 8/08
                                                         365/201

(Continued)

FOREIGN PATENT DOCUMENTS

CN          115148265 A      10/2022

OTHER PUBLICATIONS

"Chinese Application Serial No. 202210311580.0, Notification to Make Rectification mailed Apr. 19, 2022", with machine English translation, 3 pages.

(Continued)

*Primary Examiner* — Uyen Smet
(74) *Attorney, Agent, or Firm* — Schwegman Lundberg & Woessner, P.A.

(57) ABSTRACT

Some embodiments include apparatuses and methods using the apparatuses. One of the embodiments includes a capacitor, a transistor coupled to the capacitor, the transistor and the capacitor included in a memory cell; the transistor including a channel structure, a gate including a portion located on a side of the channel structure, and a dielectric structure between the channel structure and the gate; and on-die circuitry configured to selectively apply a stress condition to the transistor to tune a threshold voltage of the transistor.

18 Claims, 18 Drawing Sheets

(51) Int. Cl.
  *G11C 29/54*    (2006.01)
  *H01L 29/786*   (2006.01)
  *H10B 12/00*    (2023.01)

(52) U.S. Cl.
  CPC .... *H01L 29/78642* (2013.01); *H01L 29/7869* (2013.01); *H10B 12/50* (2023.02)

(58) Field of Classification Search
  CPC . G11C 16/3404; G11C 11/36; G11C 16/3431; H10B 12/315; H10B 12/50; H01L 29/78642; H01L 29/7869
  See application file for complete search history.

(56)  References Cited

U.S. PATENT DOCUMENTS

2019/0206861 A1*  7/2019  Beigel ............. H01L 21/823871
  2019/0296155 A1*  9/2019  Sawabe ............. H01L 29/66969
  2021/0305431 A1*  9/2021  Ishimaru ............... H01L 29/401

OTHER PUBLICATIONS

"Chinese Application Serial No. 202210311580.0, Response Filed Jun. 30, 2022 to Notification to Make Rectification mailed Apr. 19, 2022", with English claims, Claims not amended in response filed, 159 pages.

\* cited by examiner

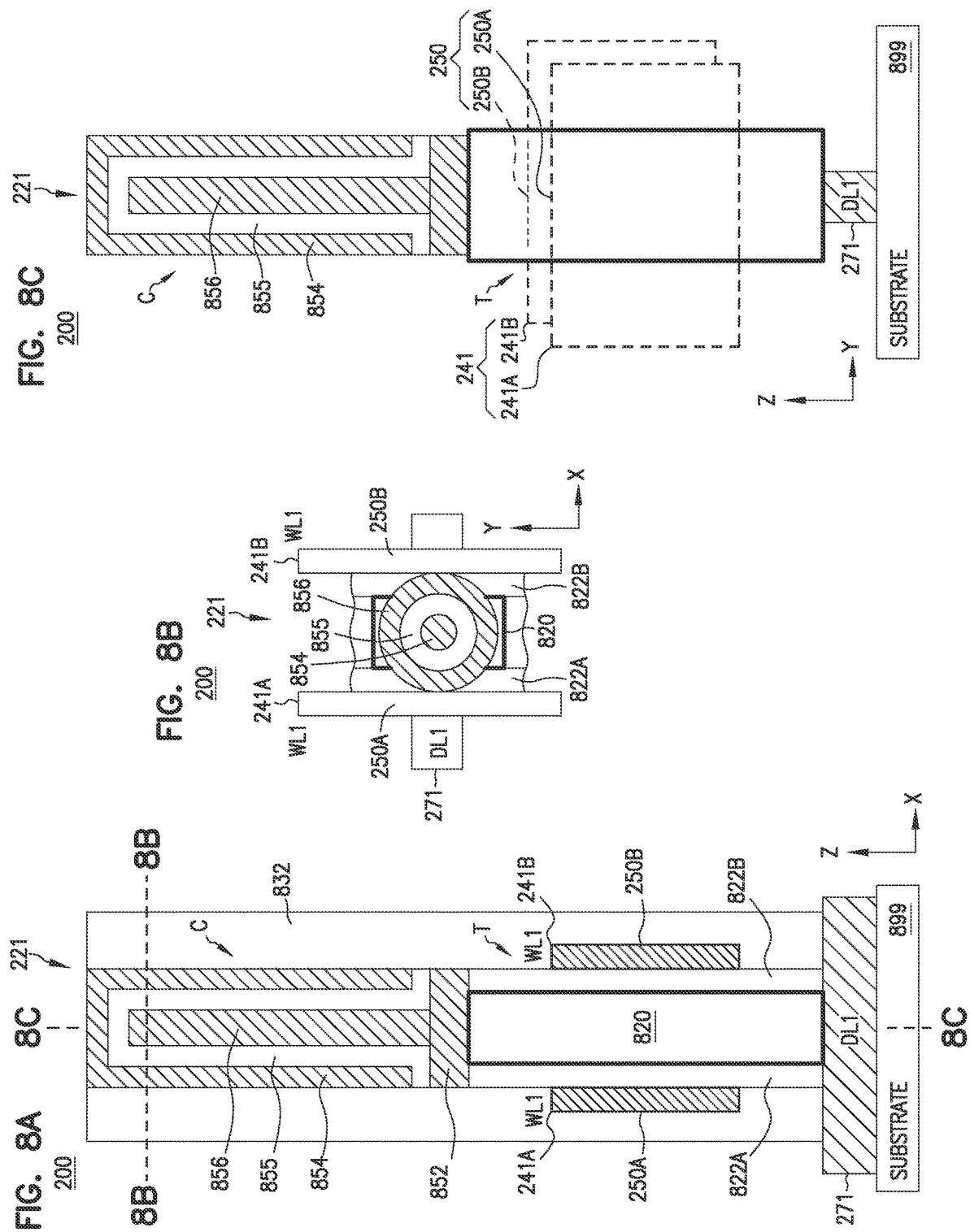

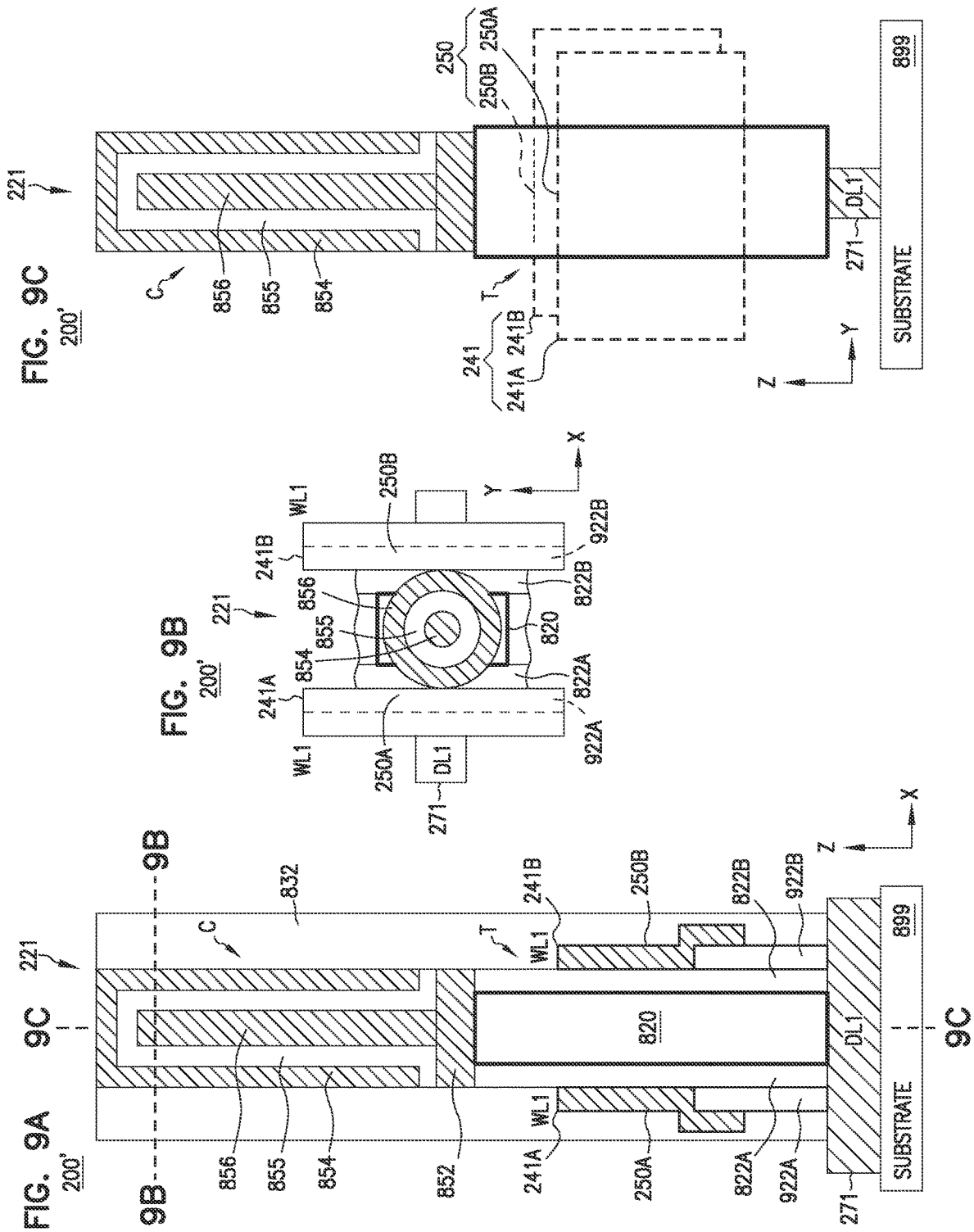

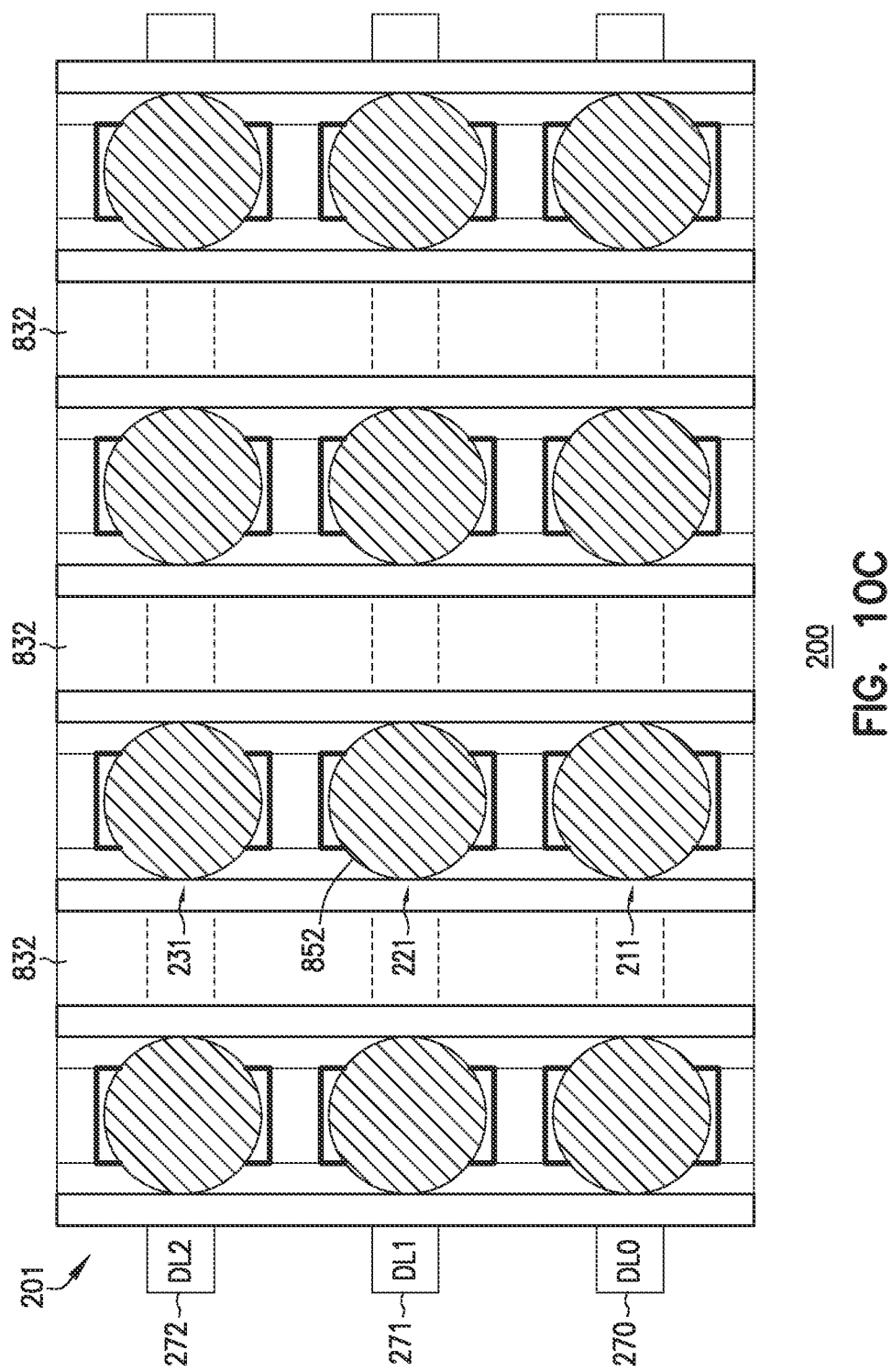

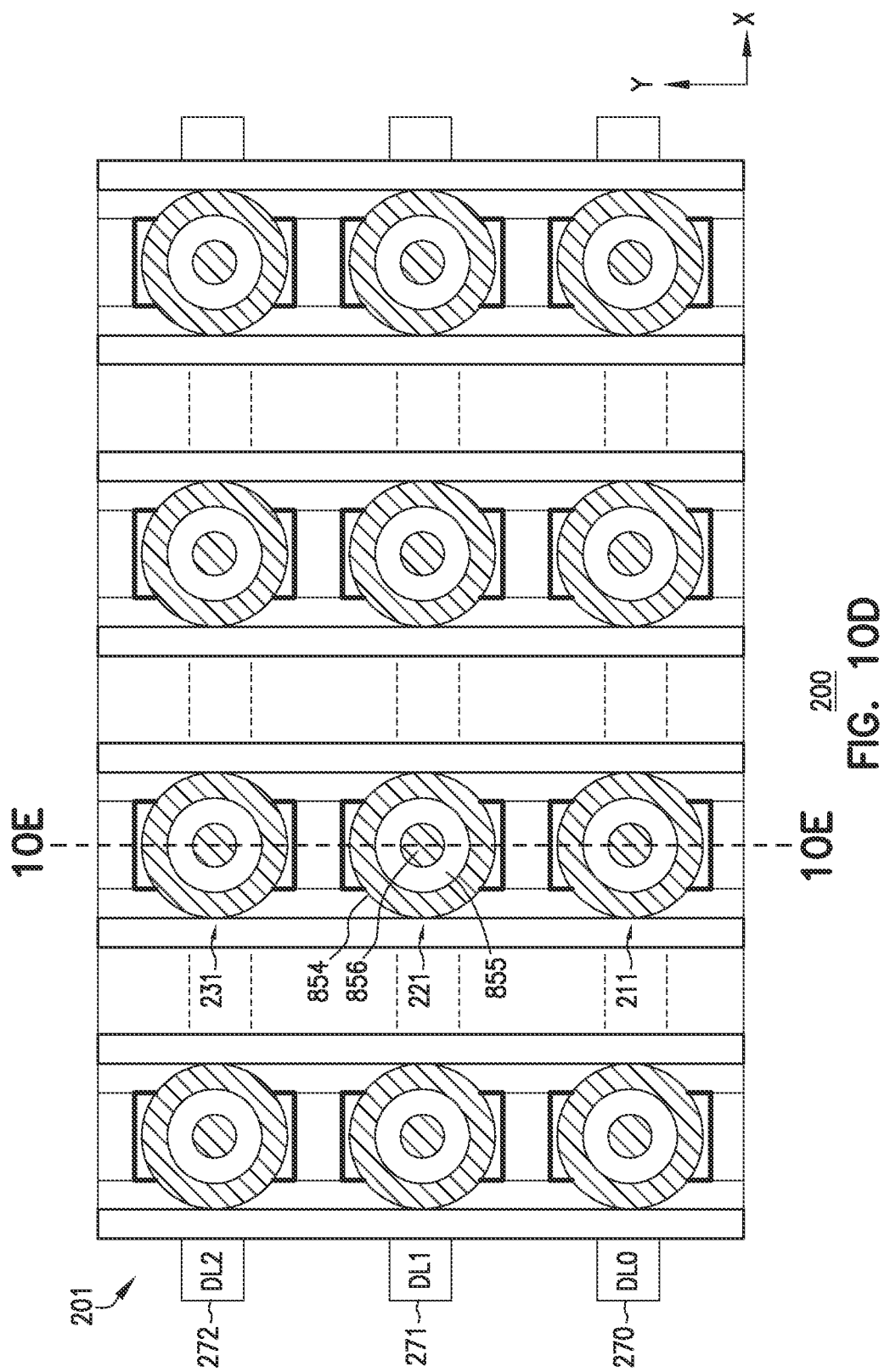

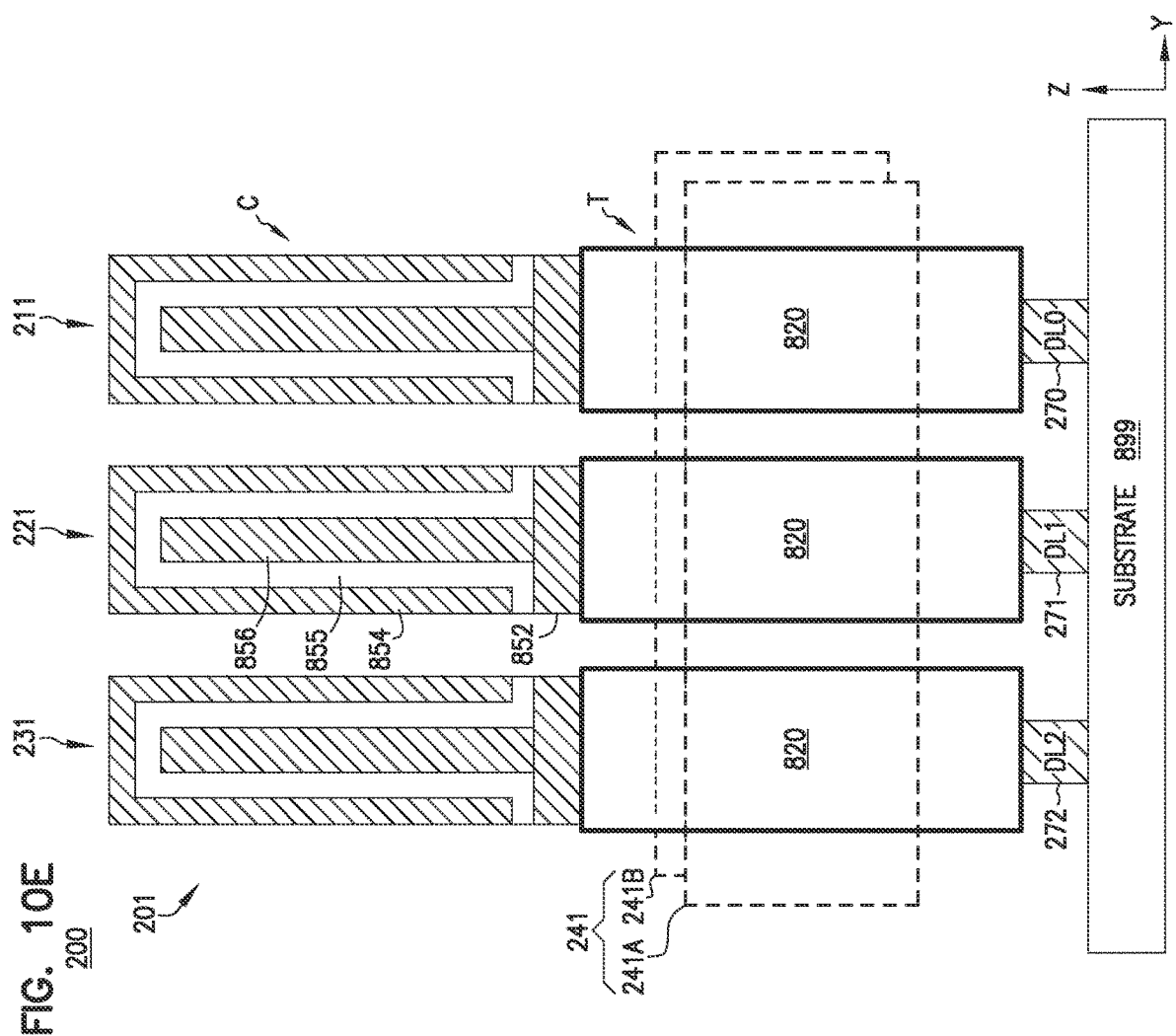

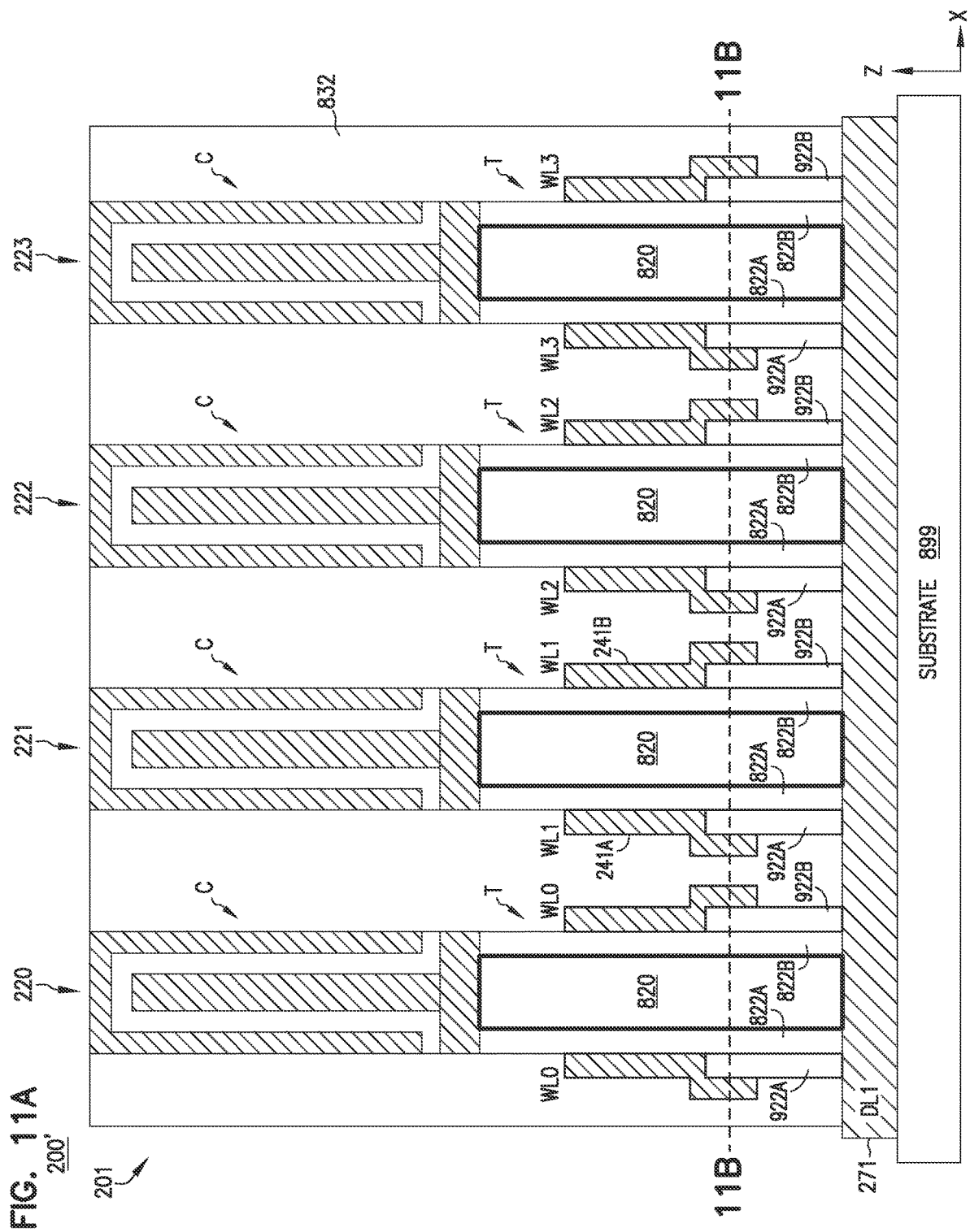

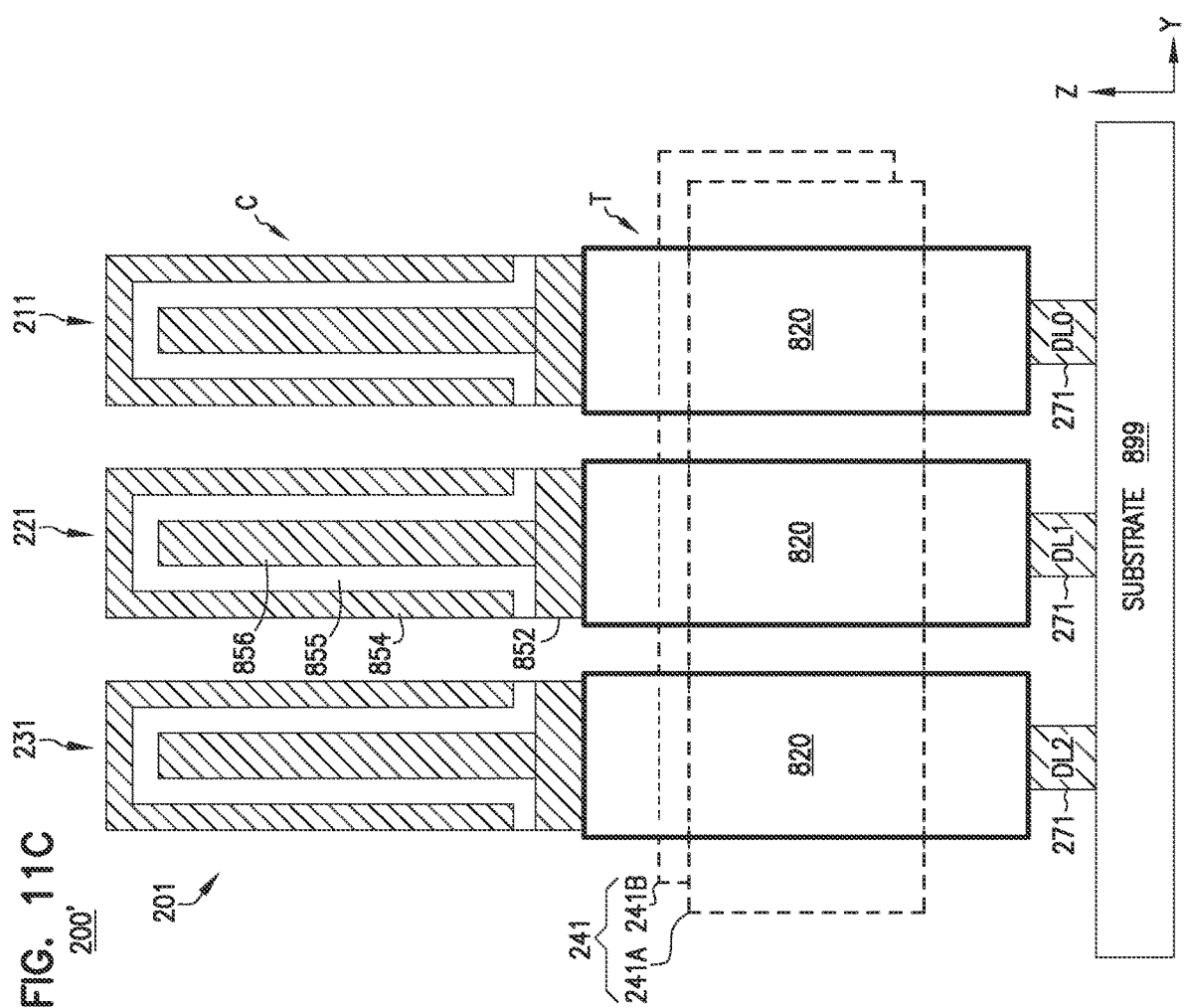

MEMORY DEVICE INCLUDING CALIBRATION OPERATION AND TRANSISTOR HAVING ADJUSTABLE THRESHOLD VOLTAGE

BACKGROUND

Memory devices are widely used in computers and many other electronic items to store information. Memory devices are generally categorized into two types: volatile memory devices (e.g., flash memory devices) and non-volatile memory devices (e.g., dynamic random access memory (DRAM) devices). A memory device usually has numerous memory cells where information can be stored. In a volatile memory device, information stored in the memory cells is lost if supply power is disconnected from the memory device. In a non-volatile memory device, information stored in the memory cells is retained even if supply power is disconnected from the memory device. The description herein involves volatile memory devices. A memory cell in a conventional volatile memory device has a capacitor to store charge. The amount of stored charge represents the value of information stored in the memory cell. The memory cell also has a transistor to allow access to the memory cell. Charge stored in the capacitor is prone to leak over time. Thus, a conventional volatile memory device has periodic refresh operations to regularly maintain the amount of charge stored in the capacitor, so that the original value of information stored in the memory cell can be retained. In some situations, variation in the structure and material of the transistor may cause excessive charge leakage from the capacitor. This can cause the memory cell to fail to properly store information or fail to retain previously stored information despite the refresh operations. Some conventional memory devices may discard failed memory cells, thereby reducing yield. Further, undetected failed memory cells can increase error in information stored in the memory device.

BRIEF DESCRIPTION OF THE DRAWINGS

FIG. 8A, FIG. 8B, and FIG. 8C show different views of a structure of a portion of the memory device of FIG. 2 including the structures of transistor and capacitor of a memory cell, an access line, and a data line, according to some embodiments described herein.

FIG. 9A, FIG. 9B, and FIG. 9C show a structure of a portion of another memory device including an alternative structure of transistor T of the memory cells of the memory device of FIG. 8A, FIG. 8B, and FIG. 8C, according to some embodiments described herein.

FIG. 10A through FIG. 10E show different views of a structure of the memory array, the access lines, and the data lines of the memory device of FIG. 8A, FIG. 8B, and FIG. 8C, according to some embodiments described herein.

FIG. 11A. FIG. 1B, and FIG. 11C show different views of a structure of a memory array, access lines, and data lines of the memory device of FIG. 9A, FIG. 9B, and FIG. 9C, according to some embodiments described herein.

DETAILED DESCRIPTION

The techniques described herein include a memory device having structures and operations that allow the memory device to detect and repair failed memory cells in the memory device. Each memory cell of the memory device includes a capacitor and a transistor. The capacitor can store charge to represent information stored in the memory cell. The transistor can be turned on or turned off to selectively access the memory cell. The transistor has structures that can be tunable to allow its threshold voltage to be adjusted (e.g., to be tuned). Variation in the structure and material of the transistor may cause the value of threshold voltage of the transistor to deviate from its target value, such that the threshold voltage of the transistor may be outside a particular range (e.g., a predetermined target range). This deviation can cause excessive charge leakage from the capacitor, leading to potential failure of the memory cell. The memory device described herein includes on-die circuitry and can be configured to perform a calibration operation to detect failed memory cells, which are memory cells that fail to properly store or retain information. The calibration operation can also include repairing failed memory cells, so that failed memory cells can be normal (good) memory cells again. Repairing a failed memory cell can include intentionally stressing the transistor to adjust (e.g., to tune) the value of the threshold voltage of the transistor. The memory device described herein can be configured to perform the calibration operation (using on-die circuitry) periodically or non-periodically. The memory device can include an error-correction code (ECC) engine that can provide information that the memory device may use as part of the calibration operation. The techniques described herein can improve yield and improve error-correction code (ECC) operations (e.g., reduce bit error rate) in the memory device or the system that has the memory device. Other improvements and benefits of the described memory device and its variations are discussed below with reference to FIG. 1 through FIG. 12.

Figure 1:
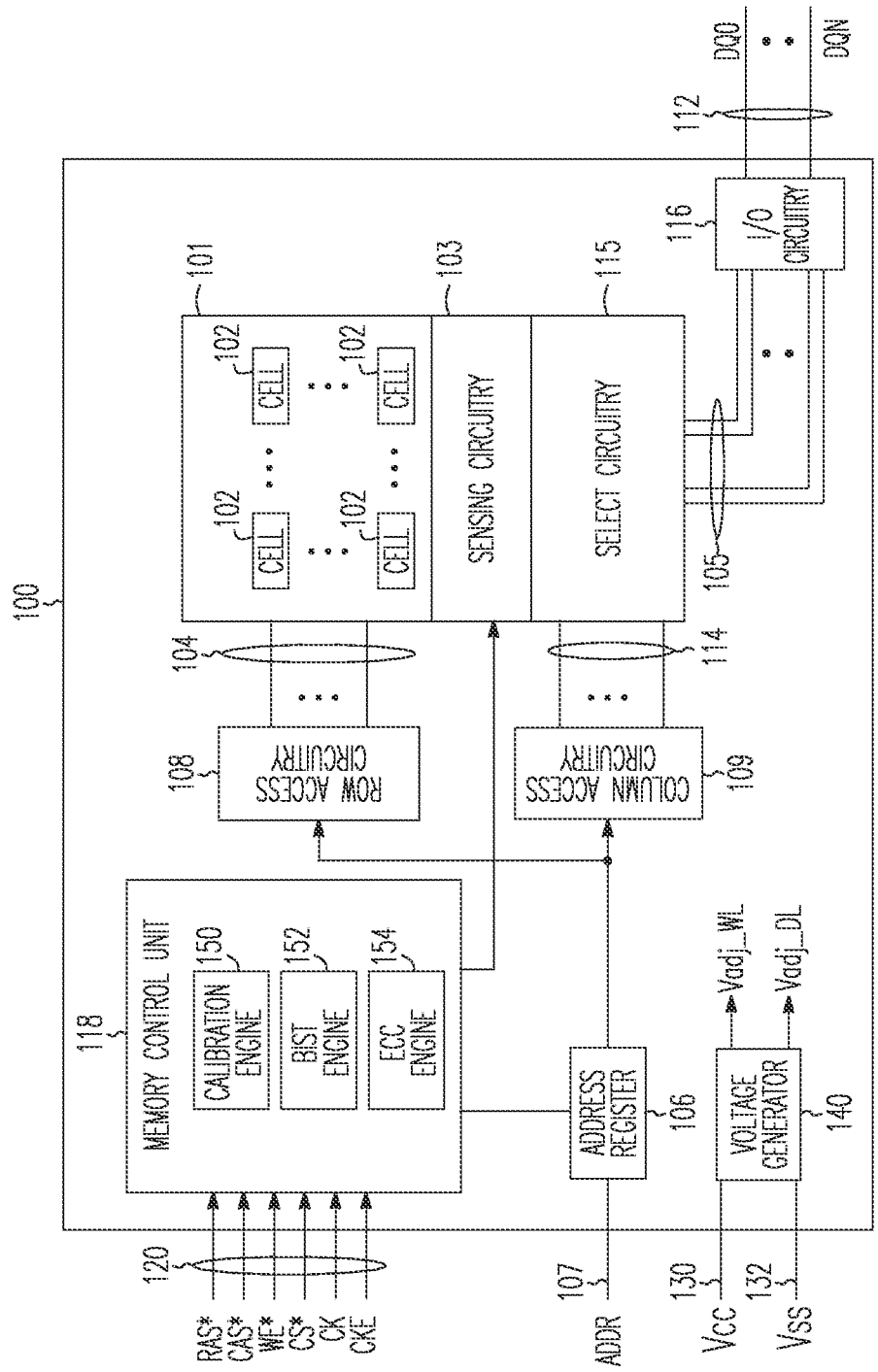
FIG. 1 shows a block diagram of an apparatus in the form of a memory device including memory cells, according to some embodiments described herein.

FIG. 1 shows a block diagram of an apparatus in the form of a memory device 100 including memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a DRAM device. Information stored in memory cells 102 of memory device 100 may be lost (e.g., invalid) if supply power (e.g., supply voltage Vcc) is disconnected from memory device 100.

Each of memory cells 102 can include a transistor and a capacitor. In a physical structure of memory device 100, the structure of the transistor can be formed vertically over a semiconductor substrate of the memory device. Each of memory cells 102 can be configured to store information that can represent a bit of information (e.g., a bit having value of binary 0 ("0") or a binary 1 ("1")). The capacitor in each of memory cells 102 can be configured to store charge. The amount of charge in the capacitor of a particular memory cell can represent the value of information (e.g., "0" or "1") stored in that particular memory cell. Memory cells 102 of memory device 100 can include normal memory cells and spare (redundant) memory cells. Normal memory cells can be used to store information during normal operations of memory device 100. Spare memory cells are reserved memory cells. Memory device 100 can replace a normal memory cell with a spare memory cell if that normal memory cell is determined to be a failed memory cell.

As shown in FIG. 1, memory device 100 can include access lines 104 and data lines 105. Access lines 104 and data lines 105 can include word lines and bit lines, respectively, of memory device 100. Memory device 100 can use access lines 104 to access memory cells 102 and data lines 105 to provide (e.g., carry) information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during operations of memory device 100.

Memory device 100 can perform a write operation to store information in memory cells 102 and a read operation to read (e.g., sense) information (e.g., previously stored information) in memory cells 102. Memory device 100 can perform a refresh operation to refresh (e.g., to keep valid) the value of information stored in memory cells 102.

Memory device 100 can also perform a calibration operation to detect (e.g., to identify) failed memory cells among memory cells 102 and to repair (e.g., fix) failed memory cells. A failed memory cell is a memory cell that fails to properly store information or fails to retain information previously stored therein. For example, a memory cell is determined to be (or deemed to be) a failed memory cell if the value of information read from that memory cell is different from (e.g., does not match) the value of information previously stored in that memory cell. The calibration operation performed by memory device 100 can repair a failed memory cell to make it a normal (e.g., good) memory cell again. Memory device 100 can also perform a memory cell replacement operation (which is different from the calibration operation) to permanently replace a failed memory cell with a spare memory cell if the calibration operation is unable to repair the failed memory cell. The calibration operation of memory device 100 can be similar to the calibration operation of the memory devices (e.g., memory device 200) described in detail below with reference to FIG. 2 through FIG. 12.

As shown in FIG. 1, memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

Memory device 100 can include a voltage generator 140 that can operate to generate voltages that can be used in operations (e.g., read, write, refresh, and calibration operations) of memory device 100. Voltage generator 140 can include voltage pumps to generate voltages (e.g., boost voltages) with relatively high voltage values than supply voltage Vcc. Examples of voltages generated by voltage generator 140 include voltages (e.g., boost voltages) Vadj_WL and Vadj_DL that can have values greater than the value of supply voltage Vcc and greater than the voltages used during read or write operation of memory device 100. During a calibration operation, memory device 100 can apply voltages Vadj_WL and Vadj_DL to respective access lines and data lines of memory device 100, as described in more details (e.g., with reference to FIG. 5, FIG. 6, and FIG. 7).

Memory control unit 118 can operate to control operations (e.g., write, read, refresh, and calibration operations) of memory device 100 based on signals on lines 120. Examples of signals on lines 120 include a row access strobe signal RAS*, a column access strobe signal CAS*, a write-enable signal WE*, a chip select signal CS*, a clock signal CK, and a clock-enable signal CKE. The combination of these signals can form commands and can be part of signals provided to a DRAM device from an external device (e.g., a processor or alternatively a memory controller) different from memory device 100.

As shown in FIG. 1, memory device 100 can include lines (e.g., global data lines or input/output lines) 112 that can carry signals DQ0 through DQN. In a write operation, the value (e.g., "0" or "1") of information provided to data lines 105 (to be stored in memory cells 102) can be based on the values of signals DQ0 through DQN on lines 112. In a read operation, the value of information (read from memory cells 102) provided to lines 112 (in the form of signals DQ0 through DQN) can be based on the values of the signals on data lines 105. In a calibration operation, information (e.g., test information) provided to data lines 105 to be stored in selected memory cells among memory cells 102 can be provided internally by memory device 100. Alternatively, information (e.g., test information) provided to data lines 105 to be stored in selected memory cells among memory cells 102 during a calibration operation can be provided by an external device (e.g., a processor or a memory controller) through lines 112.

As shown in FIG. 1, memory device 100 can include sensing circuitry 103, select circuitry 115, and input/output (I/O) circuitry 116. Column access circuitry 109 can selectively activate signals on lines (e.g., select lines) 114 based on address signals ADDR. Select circuitry 115 can respond to the signals on lines 114 to select signals on data lines 105. The signals on data lines 105 can represent the values (e.g., "0" or "1") of information to be stored in memory cells 102

(e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation or a calibration operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

As shown in FIG. 1, memory control unit 118 can include on-die circuitry, which includes calibration engine 150, built-in self-test (BIST) engine 152, and an ECC engine 154. The on-die circuitry can be configured to perform a calibration operation described herein. Memory control unit 118 can be configured to cause memory device 100 to perform the operations (e.g., read, write, refresh, and calibration operations) described herein. Configuring memory control unit 118 can include providing specific components to memory control unit 118 to enable memory control unit 118 to perform (e.g., control) the described operations. Such specific components can include firmware, hardware, or software or any combination of firmware, hardware, and software. Although not shown in FIG. 1, memory control unit 118 can include additional components such as a state machine (e.g., finite state machine), register circuits, read-only-memory (ROM), and other components that can be configured to control memory operations (e.g., read, write, refresh, and calibration operations) of memory device 100.

Calibration engine 150 can be configured (e.g., can include any combination of firmware, hardware, and software) to perform a calibration operation. As described above, the calibration operation can detect and repair failed memory cells among memory cells 102. The calibration operation can be performed periodically or non-periodically. Calibration engine 150 can be configured to provide test information (e.g., test bits) for use in the calibration operation. Memory device 100 can be configured to perform some operations without receiving a command (or commands) from an external device (e.g., a processor or a memory controller). As an example, memory control unit 118 can be configured (e.g., configured with software, firmware, hardware, or any combination of software, firmware, hardware) to cause memory device 100 to perform a calibration operation to detect and repair failed memory cells (among memory cells 102) without receiving a command from an external device (e.g., a processor or a memory controller). Alternatively, memory device 100 can be configured to perform a calibration operation to detect and repair failed memory cells (among memory cells 102) in response to a command (or commands) from an external device (e.g., a processor or a memory controller).

BIST engine 152 can operate to perform self-test operations in memory device 100 (e.g., a BIST operation in a DRAM device). BIST engine 152 can also perform a memory cell replacement operation (which is different from the calibration operation) to replace (e.g., permanently replace) failed memory cells with spare memory cells. Although the calibration operation described herein can be performed by calibration engine 150, the calibration operation described herein can alternatively be performed by BIST engine 152. Thus, in some structures of memory device 100, calibration engine 150 can be part of BIST engine 152, such that BIST engine 152 can be configured (e.g., can include any combination of firmware, hardware, and software) to perform a calibration operation described herein.

ECC engine 154 can include ECC logic configured to performed ECC operation described herein. In an example, ECC engine 154 can operate to repair errors in information read from (or to be stored in) memory cells 102. In another example, ECC engine 154 can also generate a record (e.g., a list) that includes information identifying specific locations (e.g., physical addresses of memory cell blocks) within memory array 101 where a relatively high error rate occurs. Memory device 100 can perform (e.g., non-periodically perform) the calibration operation to detect and repair failed memory cells at a specific location (e.g., a specific memory cell block) based on the error rate information recorded (e.g., listed) by ECC engine 154. For example, memory device 100 can perform the calibration operation in a memory cell block responsive to (e.g., in response) to the error rate information (recorded by ECC engine 154) associated with that memory cell block reaching a predetermined value (e.g., predetermined error rate).

FIG. 1 shows the components (e.g., calibration engine 150. BIST engine 152, and ECC engine 154) of memory control unit 118 being separated from each other as an example. However, two or more the components of memory control unit 118 can be combined as a single component. For example, calibration engine 150 can be part (e.g., a sub-component) of BIST engine 152.

Further, FIG. 1 shows calibration engine 150, BIST engine 152, and ECC engine 154 being located in memory control unit 118. However, some or all of calibration engine 150, BIST engine 152, and ECC engine 154 can be located in memory device 100 but separated from memory control unit 118. Moreover, some or all of calibration engine 150, BIST engine 152, and ECC engine 154 can be located outside memory device 100. For example, some or all of calibration engine 150. BIST engine 152, and ECC engine 154 can be located in an external device (e.g., a processor or a memory controller) coupled to memory device 100. In this example, memory device 100 can be configured to communicate (e.g., exchange commands) with external device to perform the calibration operation described herein.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 12.

Figure 2:
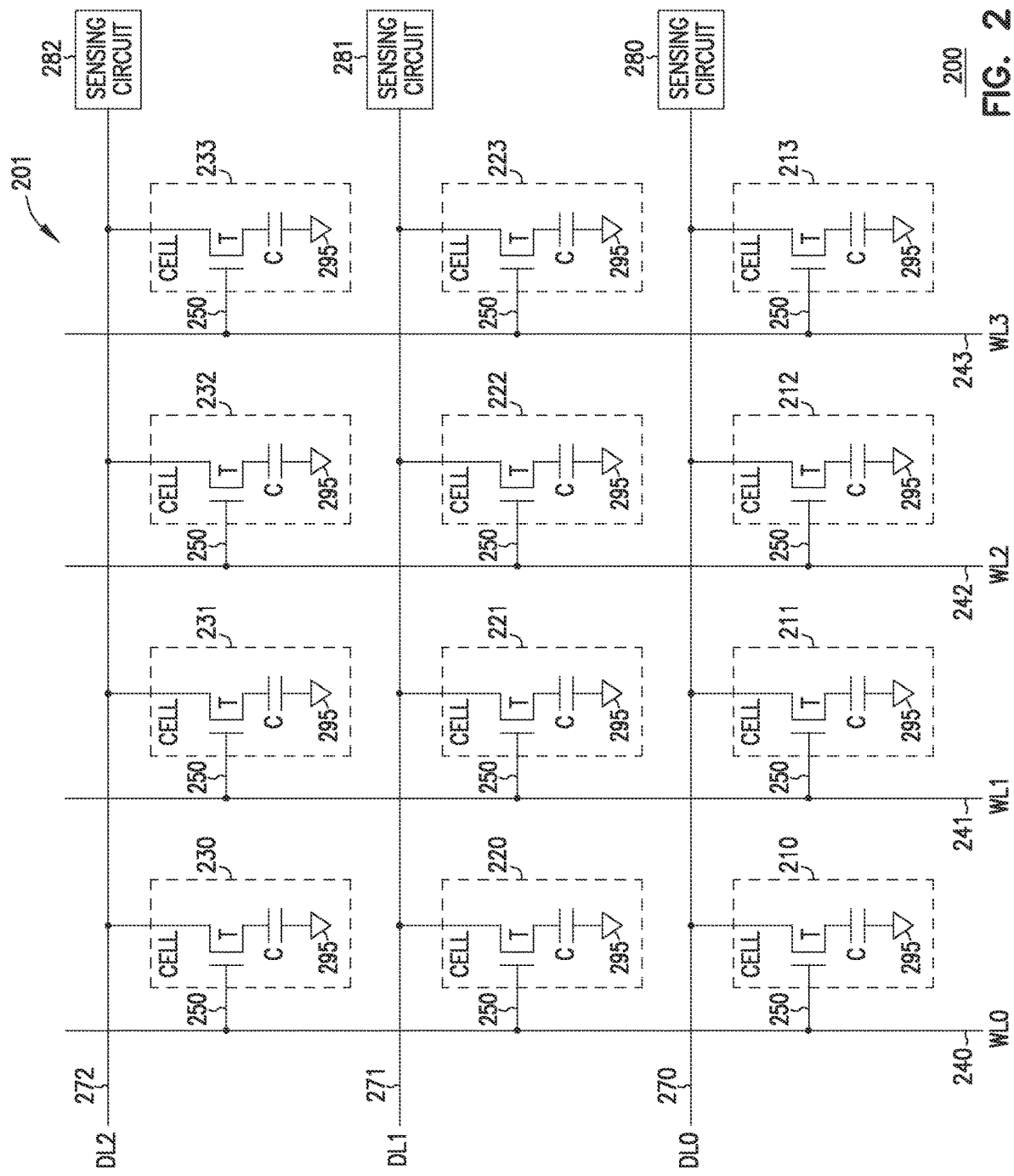
FIG. 2 shows a schematic diagram of a portion of a memory device including a memory array, access lines, data lines, and sensing circuits, according to some embodiments described herein.

FIG. 2 shows a schematic diagram of a portion of a memory device 200 including a memory array (an array of memory cells) 201, access lines 240, 241, 242, and 243, data lines 270, 271, and 272, and sensing circuits 280, 281, and 282, according to some embodiments described herein. Memory device 200 can correspond to memory device 100 of FIG. 1. For example, memory array 201 can form part of memory array 101 of FIG. 1. Memory device 200 can include a memory control unit that can be similar to or the same as memory control unit 118 (including calibration engine 150, BIST engine 152, and ECC engine 154) of memory device 100. The memory control unit of memory device 200 can be configured to perform operations (e.g., read, write, refresh, and calibration operations) like those of memory device 100.

As shown in FIG. 2, memory device 200 can include memory cells 210 through 213, 220 through 223, and 230 through 233. For simplicity, memory cells 210 through 213, 220 through 223, and 230 through 233 (and other memory cells, not shown) of memory device 200 are sometimes collectively called "the memory cells" of memory device 200. The memory cells shown in FIG. 2 are volatile memory cells (e.g., DRAM cells). For simplicity, similar or identical elements among the memory cells in FIG. 2 are given the same labels.

Memory device 200 can perform write, read, and calibration operations like memory device 100 of FIG. 1. Memory device 200 can perform a write operation to store information in selected memory cells (among the memory cells of FIG. 2), a read operation to read information from selected memory cells (among the memory cells of FIG. 2). Memory device 200 can perform a calibration operation to repair (e.g., fix) a failed memory cell (or failed memory cells). As described above, a failed memory cell is a memory cell that fails to properly store information or fails to retain information previously stored therein. As described in more detail below, the calibration operation can include a detection stage (e.g., detection process), a repair stage (e.g., repair process), and a verification stage (e.g., verification process) that can be performed one after another (e.g., performed sequentially) within the calibration operation.

As shown in FIG. 2, each of the memory cells in FIG. 2 can include a transistor T and a capacitor C coupled (e.g., directly coupled) to transistor T. Transistor T can be a field effect transistor (FET). For example, transistor T can be an n-channel FET (NFET). Part of transistor T can include a structure of an n-channel metal-oxide semiconductor (NMOS). Thus, transistor T can include an operation similar to that of an NMOS transistor.

Transistor T can have a threshold voltage Vt within a particular range (e.g., a predetermined target range). During a read or write operation of memory device, transistor T can be controlled (e.g., turned on or turned off) by providing an appropriate voltage to signal WL0, WL1, WL2, or WL3 on a respective access line (e.g., one of access lines 240-243) coupled to transistor T. Transistor T can have an adjustable threshold voltage (e.g., adjustable threshold voltage Vt). The value of threshold voltage Vt of transistor T of a particular memory cell can be adjusted during a calibration operation of memory device 200.

A particular memory cell of memory device 200 can be deemed to be a failed memory cell if the threshold voltage of transistor T of that particular memory cell is outside a particular range (e.g., a predetermined target range). Detecting a failed memory cell can include detecting whether the threshold voltage of transistor T of a particular memory cell is outside a particular range. If the threshold voltage of transistor T of a particular memory cell is outside that particular range, then that memory cell can be deemed to be a failed memory cell. If the threshold voltage of transistor T of a particular memory cell is within (not outside) that particular range, then that memory cell can be deemed to be not a failed memory cell (e.g., a good memory cell).

As shown in FIG. 2, transistor T can have a gate 250. The channel region (not labeled) of transistor T of a particular memory cell can be electrically coupled to (e.g., directly coupled to) capacitor C of that particular memory cell. In an operation (e.g., a read or write operation) of memory device 200, transistor T of a particular memory cell can be turned on and form a circuit path (e.g., current path) between capacitor C of that particular memory cell and a respective data line (e.g., one of data lines 270, 271, and 272).

Capacitor C can be configured to include a charge storage structure (e.g., a storage node), which can form the memory element of a respective memory cell of the memory cells of memory device 200. The charge storage structure of capacitor C can include an electrode (e.g., plate) that can store charge. The value (e.g., "0" or "1") of information stored in a particular memory cell can be based on the amount of charge in the charge storage structure of that particular memory cell.

Memory device 200 can include a ground connection 295 that can be coupled to an electrode of capacitor C of each of the memory cells. In the structure of memory device 200, ground connection 295 coupled to capacitor C of each of the memory cells can be part of a conductive structure that can include conductive plate (e.g., common ground plate or common ground region).

As shown in FIG. 2, access lines (e.g., word lines) 240, 241, 242, and 243 can carry respective signals (e.g., word line signals) WL0, WL1, WL2, and WL3. Each of access lines 240, 241, 242, and 243 can be structured as a conductive line (or a combination of multiple conductive lines). Gate 250 of transistor T can be part of a respective access line (e.g., a respective word line). For example, gate 250 of transistor T of memory cell 210 can be part of access line 240. In another example, gate 250 of transistor T of memory cell 211 can be part of access line 241.

Data lines (e.g., bit lines) 270, 271, and 272 can carry respective signals (e.g., bit line signals) DL0, DL1, and DL2. Each of data lines 270, 271, and 272 can be structured as a conductive line. Data lines 270, 271, and 272 can be used to provide information (in the form of signals DL0, DL1, DL2, respectively) during an operation (e.g., read or write) of memory device 200. Information on data lines 270, 271, and 272 during a write operation can represent information to be stored in selected memory cells among the memory cells of memory device 200. Information on data lines 270, 271, and 272 during a read operation can represent information read (e.g., sensed) from selected memory cells among the memory cells of memory device 200.

Sensing circuits 280, 281, and 282 can be part of sensing circuitry of memory device 200 that can be similar to sensing circuitry 103 of memory device 100 of FIG. 1. Sensing circuits 280, 281, and 282 can include components that can operate to determine the value (e.g., "0" or "1") of information on data lines 270, 271, and 272, respectively, during a write or read operation of memory device 200. The components in each of sensing circuits 280, 281, and 282 can include sense amplifier, latches, and transistors. During a write operation, sensing circuits 280, 281, and 282 can operate to sense the values (e.g., analog values of voltage or current) of signals DL0, DL1, and DL2, respectively, to determine the value (e.g., "0" or "1") of information to be stored in selected memory cells coupled to respective data lines 270, 271, and 272. During a read operation, sensing circuits 280, 281, and 282 can operate to sense the values (e.g., analog values of voltage or current) of signals DL0, DL1, and DL2, respectively, to determine the value (e.g., "0" or "1") of information read from selected memory cells coupled to respective data lines 270, 271, and 272.

As shown in FIG. 2, the cells memory cells of memory device 200 can be arranged in groups (e.g., rows and columns) associated with access lines 240, 240, 241, 242, and 243 and data lines 270, 271, and 272. FIG. 2 shows an example of four rows and associated four access lines (e.g., access lines 240, 241, 242, and 243) and three columns associated three data lines (e.g., data lines 270, 271, and 272) of memory device 200. However, memory device 200 can have numerous rows and columns of memory cells and numerous associated access lines and data lines. Further, FIG. 2 shows each row including three memory cells for simplicity. However, each row of memory cells can have numerous memory cells. The terms "row" and "column" are used herein only for ease of describing the groups of memory cells of memory device 200. The terms "row" and "column" are not intended to assign specific directions (e.g., horizontal or vertical directions) to the arrangement of the memory cells of memory device 200.

Each of access lines 240, 241, 242, and 243 can be used to access the memory cells of a respective row. For example, access line 240 can be used to access memory cells 210, 220, and 230. Access line 241 can be used to access memory cells 211, 221, and 231. Access line 242 can be used to access memory cells 212, 222, and 232. Access line 243 can be used to access memory cells 213, 223, and 233.

Access lines 240, 241, 242, and 243 can be selectively activated (e.g., activated one at a time) during an operation (e.g., read or write operation) of memory device 200. Memory cells coupled to the same access line can be concurrently accessed. Memory cells coupled to a different access line can be accessed at a different time (e.g., accessed in a sequential fashion) during an operation (e.g., read or write operation) of memory device 200. The memory cells that are accessed during an operation can be called selected memory cells. In a write operation, selected memory cells coupled to an access line can store information provided on data lines 270, 271, and 272. In a read operation, selected memory cells coupled to an access line can provide information (e.g., previously stored information) to data lines 270, 271, and 272.

Figure 3:
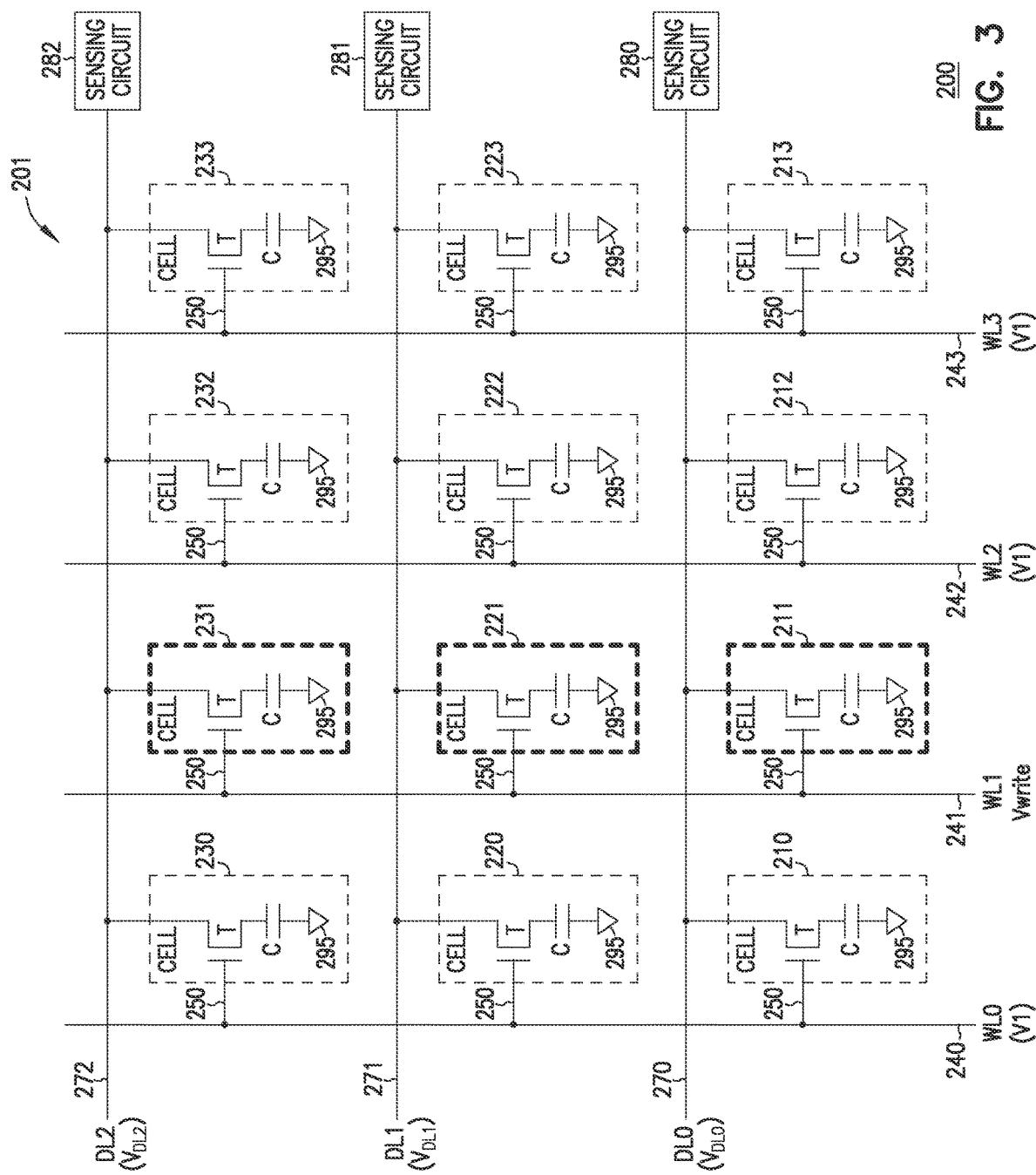
FIG. 3 shows the memory device of FIG. 2 including example voltages on respective access lines and data lines during a write operation of the memory device, according to some embodiments described herein.

FIG. 3 shows memory device 200 of FIG. 2 including example voltages Vwrite and V1 on respective access lines 240, 241, 242, and 243 and data lines 270, 271, and 272 during a write operation of memory device 200, according to some embodiments described herein. The example of FIG. 3 assumes that memory cells 211, 221, and 231 (coupled to access line 241) are selected memory cells during a write operation to store information in memory cells 211, 221, and 231. The other memory cells (e.g., memory cells coupled to respective access lines 240, 242, and 243) are assumed to be unselected memory cells, which are not selected to store information in the example of FIG. 3. Information stored in selected memory cells during a write operation can include user information (e.g., user data). Alternatively, information to be stored in memory cells 211, 221, and 231 can include test information if the write operation is part of a calibration operation (as described below with reference to FIG. 5 and FIG. 6).

In a write operation of memory device 200, voltage Vwrite can be applied to the access line coupled to the selected memory cells (e.g., memory cells 211, 221 and 231 in this example. Thus, in FIG. 4, voltage Vwrite can be provided to signal WL1 on access line 241 (which is coupled to selected memory cells 211, 221 and 231). Voltage V1 can be provided to signals WL0, WL2, and WL3 on access lines 240, 242, and 243, respectively. Voltage Vwrite can have a value to turn on transistor T of each of the selected memory cells (e.g., memory cells 211, 221, and 213 in this example). For example, voltage Vwrite can have a value of 3V.

Voltage V1 can have a value to turn off (or keep off) transistors T of the unselected memory cells. For example, voltage V1 can have a value of 0V or a negative value (e.g., −0.2V). These voltage values are example values. Different values may be used.

Signals DL0, DL1, and DL2 on respective data lines 270, 271, and 272 can have voltages $V_{DL0}$, $V_{DL1}$, and $V_{DL2}$ respectively. The value of voltage $V_{DL0}$ can vary and can be based on the value (e.g., "0" or "1") of information to be stored in memory cell 211. For example, voltage $V_{DL0}$ can have one value (e.g., 0V) if information to be stored in memory cell 211 has a value corresponding to "0" (binary 0) and another value (e.g., Vx) if information to be stored in memory cell 211 has another value corresponding to "1" (binary 1). Value Vx can be the value of voltage Vcc (e.g., a supply voltage of memory device 200). Similarly, voltage $V_{DL1}$ can have different values (e.g., 0V or Vx) based on the value (e.g., "0" or "1") of information to be stored in memory cell 221. Voltage $V_{DL2}$ can have different values (e.g., 0V or Vx) based on the value (e.g., "0" or "1") of information to be stored in memory cell 231.

Thus, in a write operation, voltages $V_{DL0}$, $V_{DL1}$, and $V_{DL2}$ can have the same value (e.g., either 0V or Vx) if information to be stored in the selected memory cells (e.g., memory cells 211, 221, and 213 in this example) have the same value (e.g., either all "0" values or all "1" values). Voltages $V_{DL0}$, $V_{DL1}$, and $V_{DL2}$ can have different values (e.g., a combination of 0V and Vx) if information to be stored in the selected memory cells have different values (e.g., a combination of "0" and "1").

Figure 4:
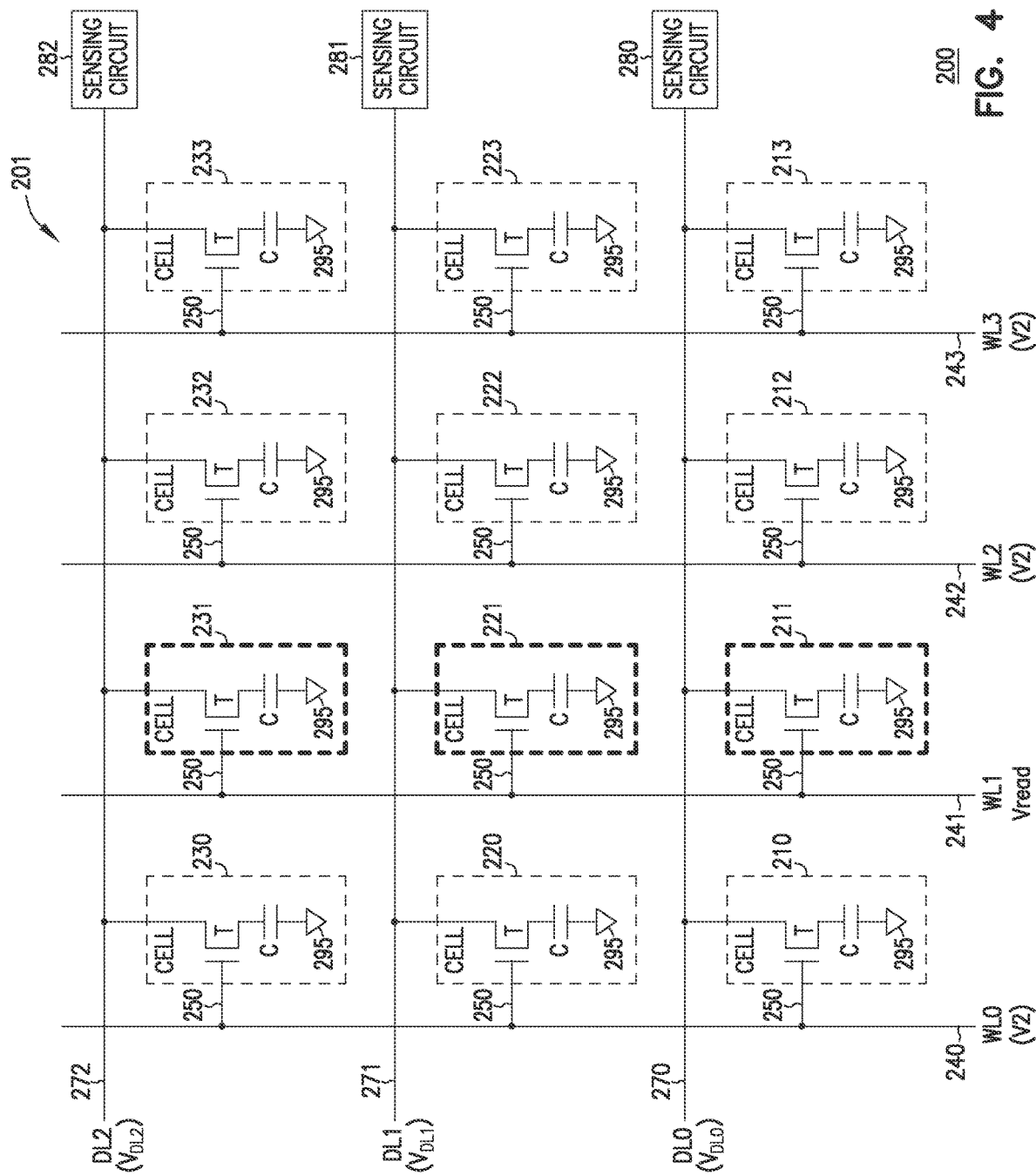
FIG. 4 shows the memory device of FIG. 2 including example voltages on respective access lines and data lines during a read operation of the memory device, according to some embodiments described herein.

FIG. 4 shows memory device 200 of FIG. 2 including example voltages Vread and V2 on respective access lines 240, 241, 242, and 243 and data lines 270, 271, and 272 during a read operation of memory device 200, according to some embodiments described herein. The example of FIG. 4 assumes that memory cells 211, 221, and 231 (coupled to access line 241) are selected memory cells during a read operation to read information from memory cells 211, 221, and 231. The other memory cells (e.g., memory cells coupled to respective access lines 240, 242, and 243) are assumed to be unselected memory cells, which are not selected to read information from them in the example of FIG. 3. Information read from selected memory cells during a read operation can include user information (e.g., user data). Alternatively, information read from selected memory cells during a read operation can include test information when the read operation is part of a calibration operation (as described below with reference to FIG. 5 and FIG. 6).

In a read operation of memory device 200, voltage Vread can be applied to the access line coupled to the selected memory cells (e.g., memory cells 211, 221 and 231 in this example. Thus, in FIG. 4, voltage Vread can be provided to signal WL1 on access line 241 (which is coupled to selected memory cells 211, 221 and 231). Voltage V2 can be provided to signals WL0. WL2, and WL3 on access lines 240, 242, and 243, respectively. Voltage Vread can have a value to turn on transistor T of each of the selected memory cells (e.g., memory cells 211, 221, and 213 in this example). The value of voltage Vread can be the same as (equal to) the value of voltage Vwrite. For example, voltage Vread can have a value of 3V.

Voltage V2 can have a value to turn off (or keep off) transistors T of the unselected memory cells. For example, voltage V2 can have a value of 0V or a negative value (e.g., −0.2V). These voltage values are example values. Different values may be used.

Voltages $V_{DL0}$, $V_{DL1}$, and $V_{DL2}$ can be voltages provided by signals DL0, DL1, and DL2, respectively, on respective data lines 270, 271, and 272. Voltage $V_{DL0}$ can have different values based on different values of information read from a respective selected memory cell. For example, voltage $V_{DL0}$ can have one value (e.g., 0V) if information read from memory cell 211 has a value corresponding to "0" and another value (e.g., Vy) if information read from memory cell 211 has a value corresponding to "1". Value Vy can be the value of voltage Vcc. Similarly, voltage $V_{DL1}$ can have different values (e.g., 0V or Vy) based on the value (e.g., "0" or "1") of information read from memory cell 221. Voltage $V_{DL2}$ can have different values (e.g., 0V or Vy) based on the value (e.g., "0" or "1") of information read from memory cell 231.

Thus, voltages $V_{DL0}$, $V_{DL1}$, and $V_{DL2}$ can have the same value (e.g., either 0V or Vcc) if information read from the selected memory cells (e.g., memory cells 211, 221, and 213 in this example) have the same value (e.g., either all "0" values or all "1" values). Voltages $V_{DL0}$, $V_{DL1}$, and $V_{DL2}$ can have different values (e.g., a combination of 0V and Vcc) if information read from the selected memory cells have different values (e.g., a combination of "0" and "1").

Figure 5:
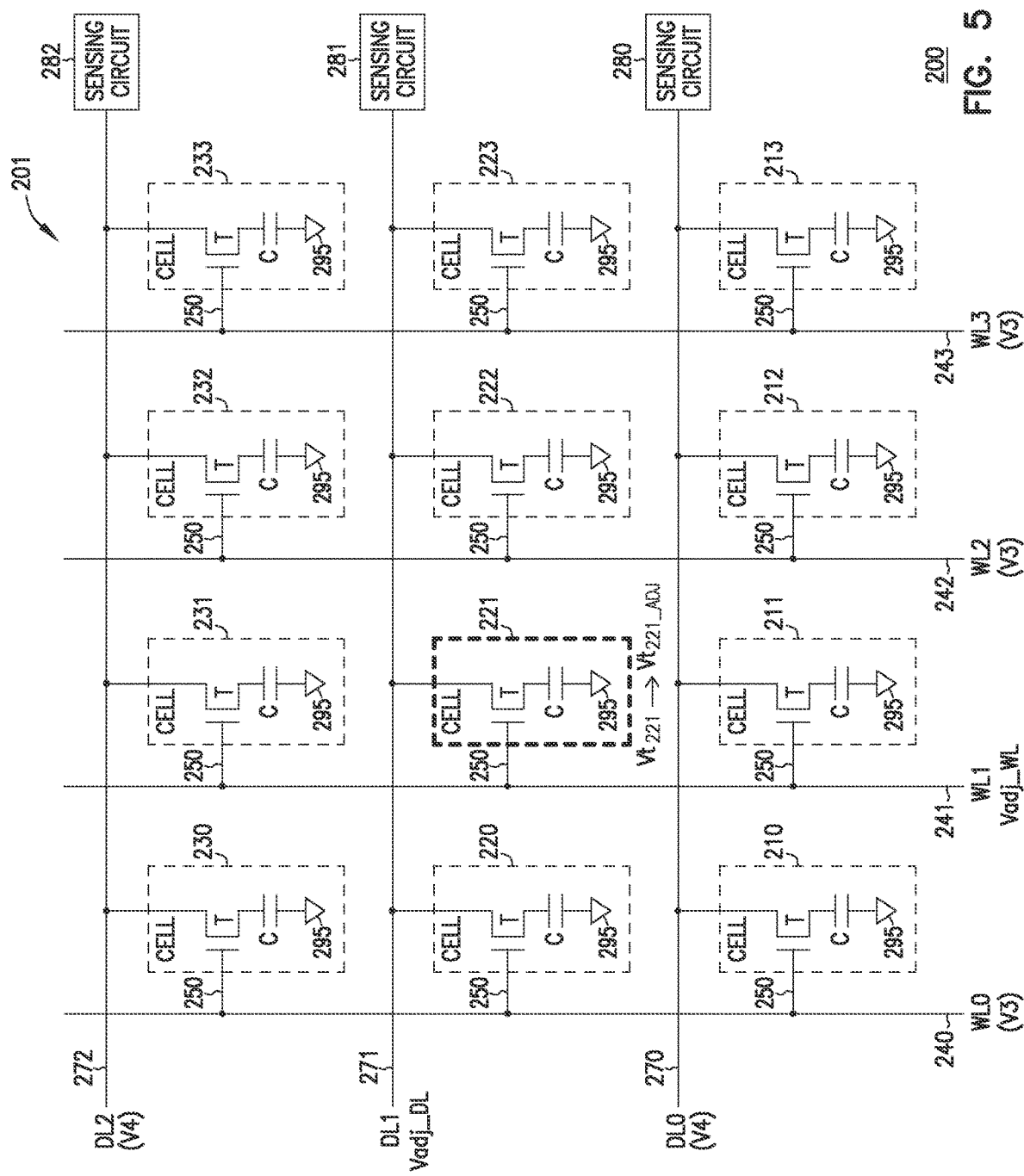
FIG. 5 shows the memory device of FIG. 2 including example voltages on respective access lines and data lines during a repair stage of a calibration operation to repair a single failed memory cell of the memory device, according to some embodiments described herein.

FIG. 5 shows memory device 200 of FIG. 2 including example voltages Vadj_WL, Vadj_DL, V3, and V4 on respective access lines 240, 241, 242, and 243 and data lines 270, 271, and 272 during a repair stage of a calibration operation to repair a single failed memory cell of memory device 200, according to some embodiments described herein. As described above with reference to FIG. 2, a calibration operation of memory device 200 can repair memory cell fails in memory device 200. The calibration process can include a detection stage, a repair stage, and a verification stage. The detection stage can be performed to detect (e.g., to identify) failed memory cells. The repair stage can be performed to repair a failed memory cell (or failed memory cells). The verification stage can be performed to verify (e.g., determine) whether a failed memory cell (or a group of failed memory cells) is repaired. Detailed operation of the calibration operation is described below with reference to FIG. 7.

FIG. 5 shows example voltages Vadj_WL, Vadj_DL, V3, and V4 applied to respective access lines 240, 241, 242, and 243 and data lines 270, 271, and 272 during the repair stage of the calibration operation. In the example of FIG. 5, memory cell 221 is assumed to be a failed memory cell. Other memory cells are assumed to be normal memory cells (good memory cells). The repair stage in the example of FIG. 5 can be performed to repair memory cell 221 (assumed to be the failed memory cell), so that it can be a normal memory cell after the repair. The repair stage can include applying a stress condition (e.g., bias temperature instability (BTI) stress) to transistor T to adjust (e.g., tuned) the value (e.g., increasing the value) of the threshold voltage Vt of transistor T of memory cell 221. For example, as shown in FIG. 5, the value of the threshold voltage Vt of transistor T of memory cell 221 can be adjusted from value $Vt_{221}$ (in volt unit) before the calibration operation to value $Vt_{221\_ADJ}$ (in volt unit) after the calibration operation. Value $Vt_{221\_ADJ}$ can be greater than value $Vt_{221}$. Thus, the repair stage can increase the value of the threshold voltage Vt of transistor T of a failed memory cell (e.g., memory cells 221 in this example).

During the repair stage associated with FIG. 5, the values of voltages Vadj_WL and Vadj_DL (applied to access line 241 and data line 271, respectively) can be selected to intentionally stress (apply a stress condition to) transistor T to adjust (e.g., increase) the value of the threshold voltage Vt of transistor T of memory cell 221 without damaging the structure (e.g., a gate oxide of transistor T) of memory cell 221. As described below with reference to FIG. 8A. FIG. 8B, FIG. 8C, FIG. 9A, FIG. 9B, and FIG. 9C, transistor T can have structures (e.g., tunable structures) to withstand such a stress (e.g., BTI stress) without being damaged during the calibration operation. Applying a stress condition (e.g., BTI stress condition) to transistor T can include selecting values (described in detail below) for voltages Vadj_WL and Vadj_DL and applying them to respective terminal (e.g., gate 250 and the drain) of transistor T for a duration (e.g., an amount time) enough to force (e.g., to stress) electrons into the tunable structure of transistor T.

In FIG. 5, voltage Vadj_WL can be selected, such that it can have a value greater than the value of the supply voltage (e.g., Vcc) of memory device 200 and greater than the value of each of voltages Vwrite (FIG. 3) and Vread (FIG. 4). Example values for voltage Vadj_WL can be in the range from 4V to 6V, which can be at least four times (e.g., four to six times) the supply voltage Vcc (e.g., Vcc=1V) of memory device 200. Voltage Vadj_DL can be not greater than 0V (e.g., 0V or a negative value (e.g., −0.5V)).

Voltage V3 can have a value to turn off (or keep off) transistors T of the unselected memory cells so that they are not selected during the repair stage. For example, voltage V3 can have a value of 0V or a negative value (e.g., −0.2V).

As shown in FIG. 5, voltage V4 can be applied to data lines 270 and 272, which are the data lines coupled to memory cells 211 and 231, respectively. Memory cells 211 and 231 are not selected to be repaired (e.g., memory cells 211 and 231 are normal memory cells), as assumed in the example repair stage associated with FIG. 5. Thus, voltage V4 can have a value such that the value of the threshold voltage Vt of each of memory cells 211 and 231 can remain unchanged (because memory cells 211 and 231 are normal memory cells). For example, voltage V4 can have a positive value (e.g., 1.5V) that is greater than (e.g., 1.5 times) the value of the supply voltage (e.g., Vcc) of memory device 200.

The values of the voltages shown in FIG. 5 and described herein are example values. Different values may be used. For example, different values for voltage Vadj_WL and Vadj_DL can be used as long as the value of the threshold voltage Vt can be adjusted (e.g., increased) to repair a failed memory cell without damaging the structure of the failed memory cell. Example structures for the memory cells of memory device 200 are shown and described below with reference to FIG. 8A, FIG. 8B, FIG. 8C. FIG. 9A. FIG. 9B, and FIG. 9C.

Excessive leakage of charge (e.g., charge stored in the capacitor) in the memory cell can cause it to become a failed memory cell. The excessive leakage of charge can occur through a leakage path (e.g., through the channel structure of transistor T). Such a leakage path may be created if the value of the threshold voltage of transistor T deviates from its target value. For example, the value of the threshold voltage of transistor T can be relatively low (e.g., due to variation in process and other factors). By adjusting (e.g., increasing) the value of the threshold voltage of transistor T of a failed memory cell, the leakage path (e.g., through transistor T) may be prevented from being created. Thus, after the repair, charge stored in capacitor C of the repaired memory cell may not leak excessively, thereby information stored in the repaired memory cell can be retained.

Figure 6:
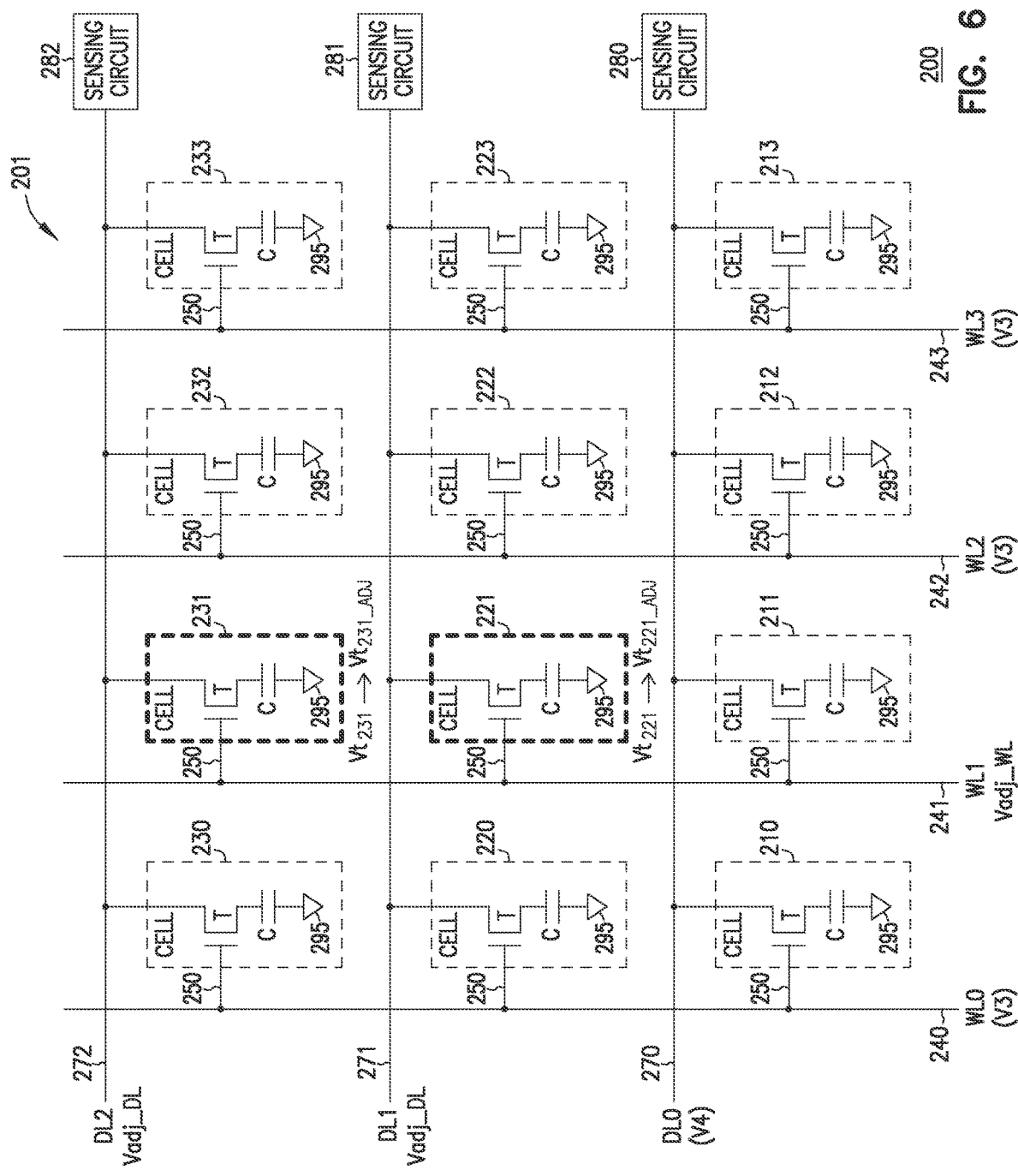
FIG. 6 shows the memory device of FIG. 2 including example voltages on respective access lines and data lines during a repair stage of a calibration operation to repair multiple failed memory cells of the memory device, according to some embodiments described herein.

FIG. 6 shows memory device 200 of FIG. 2 including example voltages Vadj_WL, Vadj_DL. V3, and V4 on respective access lines 240, 241, 242, and 243 and data lines 270, 271, and 272 during a repair stage of a calibration operation to repair multiple failed memory cells of memory device 200, according to some embodiments described herein. The repair stage of the calibration operation associated with FIG. 6 can be the same as the repair stage of the calibration operation for a single failed memory cell of memory device 200, except that multiple failed memory cells are being repaired in the example associated with FIG. 6.

Memory cells 221 and 231 are assumed to be failed memory cells in the example associated with FIG. 6. Other memory cells are assumed to be normal memory cells. In this example, the voltages applied to respective access lines 240, 241, 242, and 243 and data lines 270 and 271 can be the same as those in FIG. 5. The data lines coupled to the failed memory cells can be applied with the same voltage Vadj_DL. Thus, as shown in FIG. 6, voltage Vadj_DL can be applied to data lines 271 and 272 that are coupled to failed memory cells 221 and 231, respectively.

As shown in FIG. 6, the repair stage can cause the value of the threshold voltage Vt of transistor T of memory cell 221 to change from value $Vt_{221}$ to value $Vt_{221\_ADJ}$ (like the example associated with FIG. 5). The repair stage in FIG. 6 can also cause the value of the threshold voltage Vt of transistor T of memory cell 231 to change from value $Vt_{231\_ADJ}$ to value $Vt_{231\_ADJ}$. Value $Vt_{231}$ can be greater than value $Vt_{231\_ADJ}$.

The descriptions above with reference to FIG. 5 and FIG. 6 involve a repair stage of a calibration operation to repair failed memory cells. As described above with reference to FIG. 2, the calibration operation can include a detection stage to detect failed memory cells, a repair stage (e.g., FIG. 5 and FIG. 6) to repair failed memory cells, and a verification stage to determine (e.g., check) whether failed memory cells are repaired. The description below with reference to FIG. 7 describes more details of the calibration operation.

Figure 7:
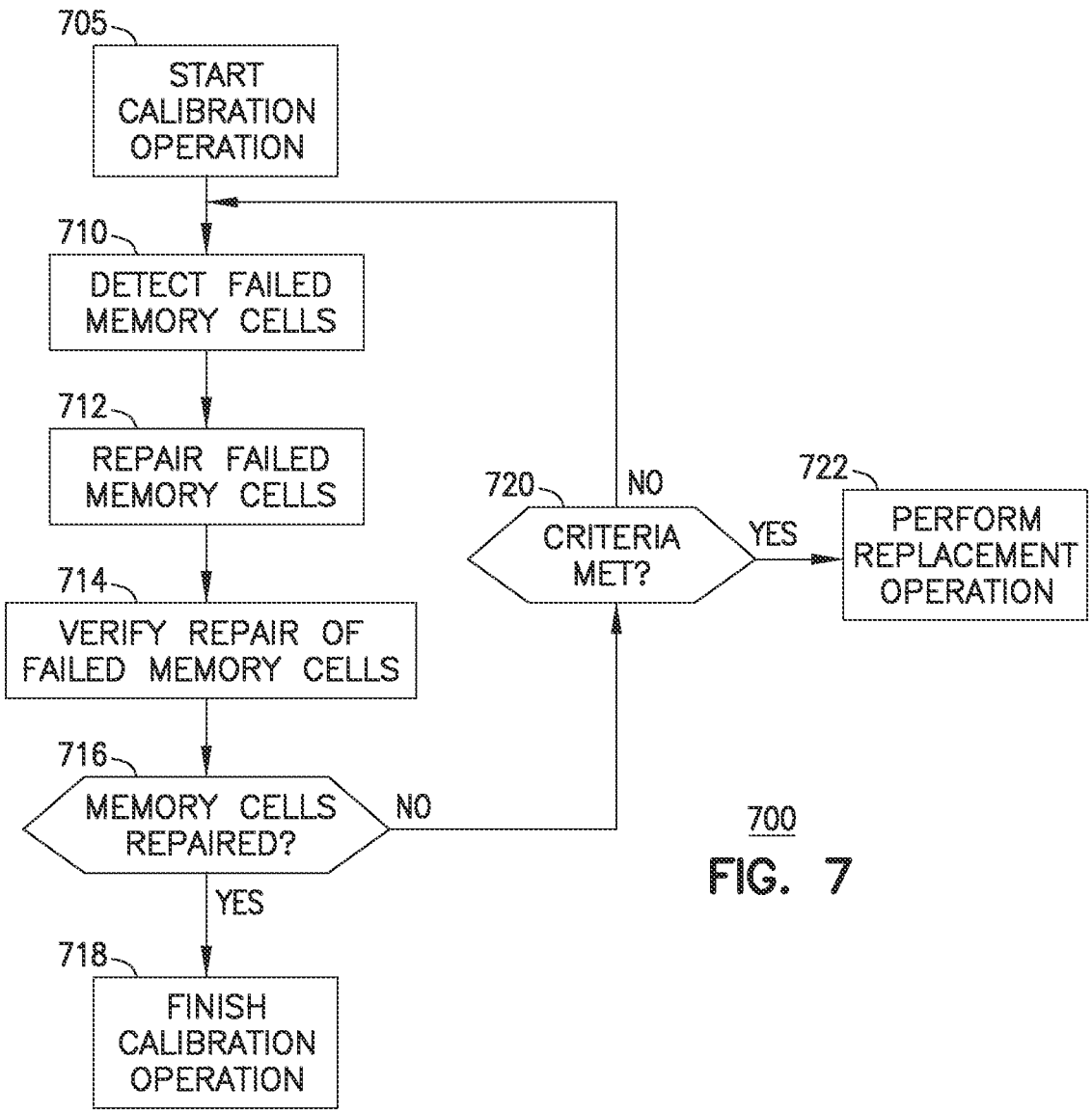
FIG. 7 is a flowchart for a method of performing a calibration operation, according to some embodiments described herein.

FIG. 7 is a flowchart for a method 700 of performing calibration operation, according to some embodiments described herein. Method 700 can be performed by a memory device such as memory device 100 of FIG. 1 or memory device 200 of FIG. 2. At least part of method 700 (the entire method 700 or less than the entire method 700) can be performed (e.g., controlled) by a memory control unit of the memory device used in method 700. Such a memory control unit can be similar to (or the same as) memory control unit 118 of FIG. 1. The memory control unit of the memory device in method 700 can be configured to include specific firmware, hardware, or software or any combination of firmware, hardware, and software to perform method 700. The memory device described in method 700 can include memory device 100 or memory device 200 or another memory device different from memory devices 100 and 200. For simplicity, the memory device described in method 700 refers to memory device 200 (FIG. 2 through FIG. 6).

As shown in FIG. 7, method 700 can include activities (e.g., operations) 705, 710, 712, 714, 716, 718, 720, and 722 that can be part of a calibration operation of memory device 200. These activities can be performed by memory device 200.

Activity 705 can include starting a calibration operation. Memory device 200 can start a calibration operation periodically or non-periodically.

Activity 710 can include performing a detection stage to detect (e.g., to identify or to determine) failed memory cells among the memory cells of the memory device 200. The detection stage can include performing a write operation to store bits of information (e.g., test information or test pattern) in respective selected memory cells among the memory cells of memory device 200. The test information can be internally provided by memory device 200. For example, a calibration engine of memory device 200 (which can be similar to calibration engine 150 of FIG. 1) can provide test information during the calibration operation of memory device. Alternatively, the test information can be externally provided to memory device 200 by an external device (e.g., a processor or a memory controller) during the calibration operation of memory device 200. The test information can include bits (test bits) having known values (binary values) to be stored in selected memory cells of memory device 200. The bits in the test information can have the same values. For example, all of the bits in the test information can have a value of "1" (binary 1).

The write operation in the detection stage in activity 710 can be similar to (or the same as) the write operation associated with FIG. 3. For example, in activity 710, three bits (e.g., test bits) of test information can be stored in respective memory cells 211, 221, and 231 (FIG. 3) such that each of memory cells 211, 221, and 231 can store a respective bit (one bit) among the three bits. The bits (three bits in this example) of test information can have the same value (binary value). For example, the bits of test information can have values "1", "1", and "1". Thus, after the write operation in activity 710, each of memory cells 211, 221, and 231 stores a bit (e.g., test bit) having value of "1".

For simplicity, only three memory cells 211, 221, and 231 are selected to store test information in the detection stage in activity 710. However, numerous memory cells (e.g., memory cells in the entire memory cell block) can be selected to store test information as part of the calibration operation.

Physical addresses of the memory cells (e.g., memory cells 211, 221, and 231 in the example of method 700) to be selected in a calibration operation can be based on information (e.g., address information) stored in the calibration engine of memory device 200 (like calibration engine 150 of FIG. 1) or alternatively based on error rate information recorded by an ECC engine of memory device 200 (like ECC engine 154 of FIG. 1).

The detection stage in activity 710 can include preforming a read operation after the write operation (after storing bits having values of "1" in memory cells 211, 221, and 231). The memory device may apply a pause for a duration (e.g., an amount of time) after the write operation to allow the stored information to settle before performing the read operation. The read operation in the detection stage in activity 710 can be performed to read the test information that was stored in memory cells 211, 221, and 231 by the write operation (in activity 710 described above). In the read operation, the memory device may iterate through array space in row addresses (e.g., associated access lines 240, 241, 242, and 243) to sense information from the memory cells. The read operation in the detection stage in activity 710 can be similar to (or the same as) the read operation associated with FIG. 4. For example, in activity 710, three bits of information can be read (e.g., sensed) from respective memory cells 211, 221, and 231 (FIG. 4), such that each of memory cells 211, 221, and 231 can provide a respective bit (one bit) among the three bits.

Activity 710 can detect failed memory cells (if any) among memory cells 211, 221, and 231 based on the value of the bits read from respective memory cells 211, 221, and 231. For example, if a bit of information read from a particular memory cell has a value of "0", which is different from expected value of "1" (of the test bit) that was previously stored, then that particular memory cell can be determined to be (e.g., deemed to be) a failed memory cell. In another example, if a bit of information read from a particular memory cell has a value of "1", which is the same as the value of "1" (of the test bit) that was previously stored, then that particular memory cell can be determined to be (e.g., deemed to be) not a failed memory cell (e.g., good memory cell).

As an example, memory cell 221 is assumed to be a failed memory cell (e.g., it fails to properly store the test bit) and memory cells 211 and 231 are assumed to be good memory cells (they properly store the test bits). Thus, the bit of information read from memory cell 221 will have a value of "0", which is different from the expected value of "1" previously stored in memory cell 221. The bit of information read from each of memory cells 211 and 231 will values of "1", which is the same as (matching) the expected value of "1" (of the test bit) that was previously stored in each of memory cells 211 and 231.

Sensing circuits 280, 281, and 282 (FIG. 4) can be used to determine the values (e.g., "0" or "1") of the bits read from memory cells 211, 221, and 231. The values determined by (e.g., output by) sensing circuits 280, 281, and 282 can be used to detect which of the selected memory cells fails. For example, the memory cell associated with a sensing circuit having an output of "0" can be determined to be (e.g., deemed to be) a failed memory cell. In this example, the outputs of sensing circuits 280, 281, and 282 can be "1", "0", and "1", respectively, which indicate that memory cell 221 (associated with sensing circuit 281) fails and memory cells 211 and 231 do not fails, as assumed in the above example used in method 700, Thus, the detection stage in activity 710 described above can include performing a write operation to store test information in selected memory cells. Then, the detection stage can include performing a read operation after the write operation. The values ("0" or "1") during the read operation from sensing circuits associated with (e.g., coupled to) the selected memory cells can be used to detect failed memory cells.

As described above with reference to FIG. 2 through FIG. 6, each of the memory cells can include a capacitor and a transistor (transistor T). The transistor can be configured to have threshold voltage within a particular range. Detecting a failed memory cell in the detection stage in activity 710 can correspond to detecting whether a threshold voltage of the transistor of a memory cell is outside a particular range. For example, the threshold voltage of transistor T of a particular memory cell (e.g., memory cell 221 in the activity 710) can be deemed to be outside a particular range if a value of information sensed from that particular memory cell in the read operation is different from a value of information stored in that particular memory cell in the write operation. In another example, the threshold voltage of transistor T of a particular memory cell (e.g., memory cell 211 or 231 in the activity 710) can be deemed to be within (not outside) a particular range if a value of information sensed from that particular memory cell in the read operation is the same as a value of information stored in that particular memory cell in the write operation.

Activity 712 of method 700 can include performing a repair stage to repair a failed memory cell (or failed memory cells). Since memory cell 221 is determined to be (or assumed to be) a failed memory cell (based on activity 710), the repair stage in activity 712 can applying stress condition to transistor T of memory cell 221 (the failed memory cell in this example). The stress condition is applied to adjust the threshold voltage Vt of transistor T of memory cell 221. The repair stage in activity 712 can be similar to or the same as the repair stage associated with FIG. 5. For example, activity 712 in FIG. 7 can include applying voltages V3, Vadj_WL. V3, and V3 on respective access lines 240, 241, 242, and 243, and applying voltages V4, Vadj_DL, and V4 on respective data lines 270, 271, and 272. These voltages can be similar to or the same as the voltages shown in FIG. 5.

The repair stage in activity 712 is performed to repair a single memory cell (e.g., memory cell 221) that fails. However, the repair stage in activity 712 can be performed to repair multiple failed memory cells similar to the repair stage associated with FIG. 6 if multiple memory cells are determined to be failed memory cells.

Voltage Vadj_DL in activity 712 can a negative voltage (e.g., −0.5V or other negative voltage). During the repair stage, the data line (e.g., data line 271 in the above example) coupled to the failed memory cell (e.g., memory cell 221) can be applied with voltage Vadj_DL. For example, voltage Vadj_DL of a negative value can be applied to data line 271 by coupling data line 271 to a negative voltage source (e.g., a negative voltage pump).

Alternatively, voltage Vadj_DL in activity 712 can be 0V. For example, voltage Vadj_DL of 0V (instead of a negative voltage) can be applied to data line 271 during the repair stage in activity 712. In this example, data line 271 can remain coupled to ground while sensing circuit 281 outputs "0" during the read operation in the detection stage in activity 710.

The repair stage in activity 712, as described above, can adjust (e.g., increase) the value of the threshold voltage of transistor T of the failed memory cell. The failed memory cell can be a normal memory cell after the repair stage.

Thus, as described above, activity 710 can detecting a failed memory cell (or failed memory cells) of the memory cells. Activity 712 can include adjusting a value of a threshold voltage of the transistor of the failed memory cell (or failed memory cells) in response to the detecting the failed memory cell (or failed memory cells) performed in activity 710.

Activity 714 of method 700 can include performing a verification stage to determine whether a failed memory cell is repaired (or failed memory cells are repaired). The verification stage can include repeating the detection stage in activity 710, and then repeating the repair stage in activity 712 if a failed memory cell is detected in repeating the detection stage.

In the repeated detection stage of activity 710, the same memory cells (e.g., memory cells 211, 221, and 231) can be selected again to store test information regardless of the number of failed memory cells among the selected memory cells. Alternatively, only failed memory cells (e.g., memory cell 221 in the above example) are selected to store test information in the repeated detection stage.

In the repeated repair stage (if performed) either the value of voltage Vadj_WL can be increased or the duration (e.g., an amount of time millisecond unit) that voltage Vadj_WL is applied to the access line can be increased. Thus, the value of voltage Vadj_WL used in the repeated repair stage in activity 712 can be greater than the value of voltage Vadj_WL used in the preceding repair stage in activity 712. The duration that voltage Vadj_WL is applied to the access line can remain unchanged between the repeated repair stage and the preceding repair stage while the value of voltage Vadj_WL is increased.

In an alternative operation, the value of voltage Vadj_WL used in the repeated repair stage in activity 712 can be the same as the value of voltage Vadj_WL used in the preceding repair stage in activity 712. In the alternative operation, the duration that voltage Vadj_WL is applied to the access line can be increased.

Activity 716 can include determining whether all failed memory cells are repaired based on the verification stage in activity 714. For example, memory cell 221 was determined to be a failed memory cell, as described above. Activity 716 can determine that memory cell 231 is repaired if the value (e.g., "1") of information read from memory cell 213 in a read operation of the repeated detection stage matches the value (e.g., "1") of a test bit stored in memory cell 231 in the repeated detection stage. In the opposite, activity 716 can determine that memory cell 231 remains a failed memory cell if the value (e.g., "0") of information read from memory cell 213 in a read operation of the repeated detection stage does not match (e.g., if the read value is "0") the value (e.g., "1") of a test bit stored in memory cell 231 in the repeated detection stage.

Method 700 can go from activity 716 to activity 718 to finish (end) the calibration operation if all failed memory cells are repaired, as indicated by "YES" from activity 716. If activity 718 is performed, then the rest of the activities of method 700 (e.g., activities 720 and 222) can be omitted (not performed).

Method 700 can go from activity 716 to activity 720 if a failed memory cell remains unrepaired, as indicated by "NO" from activity 716.

Activity 720 can include determining whether a criteria (e.g., a predetermined condition) is met (is satisfied). The criteria in activity 720 can include whether the number of detection stage in activity 710 and repair stage in activity 712 (that method 700 has performed) reaches a selected number (e.g., a predetermined number). For example, if the selected number is set at three, then the criteria in activity 720 is met if each of the detection stage and repair stage have been performed three times. In this example, the criteria in activity 720 is not met if each of the detection stage and repair stage have been performed less than three times.

Method 700 can continue with (e.g., repeat) activities 710, 712, 714, and 716 at least one more time if the criteria is not met, as indicated by "NO" from activity 720.

Method 700 can go from activity 720 to activity 722 if the condition is met, as indicated by "YES" from activity 720. The condition being met in this situation can indicate that at least one failed memory cell is unrepairable (e.g., beyond repair) by activity 714.

Activity 722 can include performing a memory cell replacement operation to replace failed memory cells with spare (e.g., redundant) memory cells. The memory cell replacement operation can be performed by the BIST engine of memory device 200 (which can be similar to or the same as BIST engine 152 of memory device 100 of FIG. 1) or by another component in the memory control unit of memory device 200.

Method 700 described above can be performed during manufacturing (e.g., during probe test) of memory device 200. Alternatively or additionally, method 700 can be performed by memory device 200 after it is included in an electronic device or system (e.g., a computer or other devices or systems).

Method 700 can be performed non-periodically, periodically, or both. For example, in a non-periodical example, memory device 200 can be configured to perform the calibration operation of method 700 during initialization period (e.g., at power-on stage or boot stage) of an electronic device or system each time the electronic device or system is turned on. In another example, memory device 200 can be configured to perform the calibration operation of method 700 non-periodically responsive to information (e.g., error rate information) provided by an ECC engine (as described above). In a periodical example, memory device 200 can be configured to perform the calibration operation of method 700 at every X interval, where X can be a number representing an amount of time (e.g., an amount of time in milliseconds or seconds or other unit of time). For example, memory device 200 can include memory elements (e.g., a register circuit) that can store the value of X, then memory device 200 can perform a calibration operation at very X interval. The memory elements (e.g., a register circuit) can be included in a memory control unit of memory device 200 (e.g., like memory control unit 118 of FIG. 1).

As described above, memory device 200 can correspond to memory device 100 of FIG. 1. Thus, memory device 200 can include a BIST engine like BIST engine 152 of memory device 100. Memory device 200 can be configured to perform the calibration operation of method 700 as part (as one of the steps) of the BIST operation of memory device 200.

FIG. 8A, FIG. 8B, and FIG. 8C show different views of a structure of a portion of memory device 200 including the structures of transistor T and capacitor C of memory cell 221, access line 241, data line 271, according to some embodiments described herein. The structures of other memory cells of memory device 200 can be similar to or the same as the structure of memory cell 221 shown in FIG. 8A, FIG. 8B, and FIG. 8C. In FIG. 8A, FIG. 8B, and FIG. 8C, directions X, Y, and Z correspond to the 3-dimensional directions of the structure of memory device 200.

For simplicity, cross-sectional lines (e.g., hatch lines) are omitted from most of the elements shown in FIG. 8A, FIG. 8B, and FIG. 8C and other figures (e.g., FIG. 9A through FIG. 11C) in the drawings described herein. Some elements of memory device 200 may be omitted from a particular figure of the drawings so as to not obscure the description of the element (or elements) being described in that particular figure. The dimensions (e.g., physical structures) of the elements shown in the drawings described herein are not scaled.

FIG. 8A shows a side view (e.g., cross-section) of a structure of a portion of memory device 200 in the X-Z direction. FIG. 8B shows a cross-section (e.g., top view in the X-Y plan) of a portion of capacitor C taken along line 8B-8B of FIG. 8A. FIG. 8C shows a cross-section in the Y-Z direction of a portion of memory device 200 taken along line 8C-8C of FIG. 8A.

As shown in FIG. 8A and FIG. 8C, memory device 200 can include a substrate 899 over which transistor T and capacitor C of memory cell 221 of memory device 200 can be formed. Capacitor C can be formed over transistor T over substrate 899, such that capacitor C can be stacked over transistor T. Substrate 899 can be a semiconductor substrate (e.g., silicon-based substrate) or other types of substrates.

Data line 271 can be located under memory cell 221 (with respect to the Z-direction) and between memory cell 221 and substrate 899. Data line 271 can include a conductive material (e.g., titanium nitride (TiN) or other conductive materials (e.g., metal)). Data line 271 can be coupled (e.g., directly coupled to) a structure 820 of transistor T of memory cell 221.

Access line 241 can include portions 241A and 241B that can be electrically coupled to each other by a conductive connection (not shown). For example, memory device 200 can include a conductive material (e.g., not shown) that can contact (e.g., electrically couple to) portions 241A and 241B, such that portions 241A and 241B (which are part of access line 241) can be concurrently applied by the same signal (e.g., signal WL1 in FIG. 2). Access line 241 can include a conductive material (e.g., titanium nitride or other conductive materials (e.g., metal)). Access line 241 and data line 271 can have the same conductive material or different conductive materials.

As shown in FIG. 8A, FIG. 8B, and FIG. 8C, transistor T can include portions 250A and 250B that are part of gate 250, structure 820, a dielectric structure (e.g., gate dielectric structure) 822A between portion 241A of access line 241, and a dielectric structure (e.g., gate dielectric structure) 822B between portion 241B of access line 241 and structure 820. The materials and structures of dielectric structures 822A and 822B can be considered tunable structures in that they can allow the value of the threshold voltage of transistor T to be adjusted (e.g., to be tuned), as described in more detail below.

Gate 250 can be formed from part of access line 241 (e.g., can include a portion of access line 241), such that portions 250A and 250B of gate 250 can include part of portions 241A and 241B, respectively. Portions 250A and 250B can be opposite from each other in the X-direction. As shown in FIG. 8A, structure 820 can have opposite sides (e.g., left side and right side) in the X-direction. Portion 250A can be located on one side (e.g., left side) of structure 820. Portion 250B can be located on another side (e.g., right side) of structure 820. Dielectric structure 822A can be located between portion 250A (part of portion 241A of access line 241) and structure 820 and contacting portion 250A and structure 820. Dielectric structure 822A can electrically separate structure 820 from portion 250A. Similarly, dielectric structure 822B can be located between portion 250B (part of portion 241B of access line 241) and structure 820 and contacting structure 820 from portion 250B. Dielectric structure 822A can electrically separate structure 820 from portion 250B.

Structure 820 can contact (e.g., can be directly coupled to) data line 271. Structure 820 can include a material that can be conductive and can form a conductive channel (e.g., a current path in a read or write operation) that can be part of a conductive path between data line 271 and capacitor C. Example materials for channel structure 820 include silicon (e.g., undoped polysilicon or conductively doped polysilicon). Other examples for structure 820 include semiconducting oxide materials, transparent conductive oxide materials, and other conductive oxide materials.

As an example, structure 820 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, the materials listed above reduce or prevent leakage of charge from the memory cells. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

In FIG. 8A. FIG. 8B, and FIG. 8C, structure 820 can form a source (e.g., source terminal), a drain (e.g., drain terminal), and a channel region (e.g., transistor channel) of transistor T. Thus, as shown in FIG. 8A. FIG. 8B, and FIG. 8C, the source, the drain, and the channel region of transistor T of memory cell 221 can be formed from a single structure (e.g., a single piece) of the same material (or alternatively, a single piece of the same combination of materials). Therefore, the source, the drain, and the channel region of transistor T of memory cell 221 can be formed from the same material of the same conductivity type (e.g., either n-type or p-type). Since structure 820 can form a conductive channel of transistor T, structure 820 can be called a channel structure of transistor T.

Dielectric structures 822A and 822B can have the same dielectric materials. For example, dielectric structures 822A and 822B can include silicon dioxide ($SiO_2$). Alternatively, dielectric structures 822A and 822B can include aluminum oxide ($Al_2O_3$) or other high-k dielectric materials. A high-k dielectric material is a dielectric material that has a dielectric constant greater than the dielectric constant of silicon dioxide. In FIG. 8A and FIG. 8B, although each of structures 822A and 822B is shown as single structure (e.g., single piece (e.g., layer)), each of structures 822A and 822B can include multiple dielectric portions (e.g., multiple layers of dielectric materials in the X-directions) of different dielectric materials.

Capacitor C can include a conductive contact 852, an electrode (e.g., capacitor plate) 854, an electrode (e.g., capacitor plate) 856, and a dielectric material (capacitor dielectric structure) 855 between electrodes 854 and 856. Capacitor C can be configured to store charge (e.g., store charge in electrode 856). The amount of charge can represent the value (e.g., "0" or "1") of information stored in memory cell 221.

Electrodes 854 and 856 can include conductive material (e.g., tungsten or other metals). Dielectric material 855 can include a high-k dielectric material or other dielectric materials. Examples materials of dielectric material 855 include aluminum oxide ($Al_2O_3$), hafnium oxide ($HfO_2$), and Zirconium dioxide ($ZrO_2$). Using such a high-k dielectric material (e.g., instead of silicon dioxide) can improve the performance (e.g., reduce current leakage, increase drive capability of transistor T, or both) of memory device 200.

Although not shown in FIG. 8A, FIG. 8B, and FIG. 8C, memory device 200 can include an additional structure (e.g., a structure of metal, conductively doped polysilicon, or other conductive materials) that can be electrically coupled to electrode 854 of capacitor C. The additional structure can be part of ground connection 295 (FIG. 2).

Memory device 200 can include a dielectric material 832 that can insulate components (e.g., access line 241, conductive contact 852, and electrode 854) of memory cell 221 from other memory cells (not shown). Dielectric material 832 can include silicon dioxide or silicon nitride ($Si_3N_4$).

As described above with reference to FIG. 5, FIG. 6, and FIG. 7, memory device 200 can perform a calibration operation to adjust (e.g., to change) the value of the threshold voltage of transistor T as part of repairing failed memory cells. In FIG. 8A. FIG. 8B, and FIG. 8C, dielectric materials 882A and 882B can be configured (e.g., by selecting appropriate dielectric materials) to trap charge (e.g., electrons). As described above, during a repair stage of a calibration operation, gate 250 of transistor T (part of a respective access line) can be applied (intentionally applied) with a relatively higher voltage in comparison with voltages applied to gate 250 of transistor T during a read or write operation. In FIG. 8A. FIG. 8B, and FIG. 8C, the higher voltage applied at gate 250 (at portions 250A and 250B) of transistor T can induce a charge trapping event (e.g., induce stress to transistor T) where charge (e.g., electrons) can be trapped in dielectric materials 882A and 882B. The trapped charge can cause the value of the threshold voltage of transistor T to change (e.g., increase). Dielectric materials 882A and 882B can be selected such that transistor T can avoid damage from the charge trapping event. As described above, dielectric structures 822A and 822B can include an oxide material (e.g., aluminum oxide ($Al_2O_3$), or other high-k dielectric materials) that can be configured to allow transistor T to withstand the stress from the charge trapping event, so that the value of the threshold voltage of transistor T can be adjusted without causing damage (e.g., physical damage to the oxide material) to transistor T.

Thus, as described above with reference to FIG. 8A, FIG. 8B, and FIG. 8C, transistor T of memory cell 221 can include a structure to allow the value of the threshold voltage Vt of transistor T to be adjusted (e.g., to be tuned). This can allow memory device 200 to repair memory cell 221 in a calibration operation as described above (e.g., by adjusting the value of the threshold voltage Vt of transistor T of memory cell 221) if memory cell 221 is detected to be a failed memory cell. As mentioned above, other memory cells of memory device 200 can include similar or the same structure as memory cell 221. Thus, the other memory cells can also be repaired in a calibration operation as described above (e.g., by adjusting the value of the threshold voltage Vt of transistor T the other memory cells) if the other memory cells are detected to be failed memory cells.

FIG. 9A. FIG. 9B, and FIG. 9C show a structure of a portion of a memory device 200' including an alternative structure of transistor T of the memory cells of memory device 200 of FIG. 8A, FIG. 8B, and FIG. 8C, according to some embodiments described herein. Memory device 200' is a variation of memory device 200 and can include elements and operations similar to or the same as memory device 200. As shown in FIG. 9A, FIG. 9B, and FIG. 9C, memory device 200' can include similar or the same elements as memory device 200 shown in FIG. 8A, FIG. 8B, and FIG. 8C except for the structure of transistor T in memory device 200'. Thus, for simplicity, the description herein does not repeat detailed description of similar or the same elements between memory devices 200 and 200'.

FIG. 9A. FIG. 9B, and FIG. 9C show the structure of one memory cell (e.g., memory cell 221) of memory device 200'. Other memory cells of memory device 200' can have similar or the same structure. Each of the memory cells (e.g., memory cells 210 through 213, 220 through 223, and 230 through 233 of FIG. 2) of memory device 200 (FIG. 2) can also have the structure of memory cell 221 of FIG. 9A, FIG. 9B, and FIG. 9C.

As shown in 9A, FIG. 9B, and FIG. 9C, transistor T of memory cell 221 can include additional dielectric portions (e.g., dielectric structures) 922A and 922B. At least part (e.g., top part) of dielectric portion 922A can be located between dielectric structure 822A and portion 250A of gate 250 and contacting dielectric structure 822A and portion 250A. At least part (e.g., top part) of dielectric portion 922B can be located between dielectric structure 822B and portion 250B of gate 250 and contacting dielectric structure 822B and portion 250B.

As shown in FIG. 9A, dielectric portion 822A can include a side (e.g., right side in the X-direction) contacting channel structure 820, and a side (e.g., left side in the X-direction) contacting portion 250A of gate 250 and dielectric portion 922A. Dielectric portion 822B can include a side (e.g., left side in the X-direction) contacting channel structure 820, and a side (e.g., right side in the X-direction) contacting portion 250BA of gate 250 and dielectric portion 922B. The materials and structures of dielectric structures 922A and 922B can be considered tunable structures in that they can allow the value of the threshold voltage of transistor T to be adjusted (e.g., to be tuned), as described in more details below.

Thus, as shown in FIG. 9A. FIG. 9B, and FIG. 9C, the combination of dielectric structure 822A and dielectric portion 922A forms a dielectric structure (a combined dielectric structure having dielectric portions formed by respective dielectric structure 822A and dielectric portion 922A) located between portion 250A of gate 250 and structure 820 and electrically separating structure 820 from portion 250A of gate 250. Similarly, the combination of dielectric structure 822B and dielectric portion 922B forms a dielectric structure (a combined dielectric structure having dielectric portions formed by respective dielectric structure 822B and dielectric portion 922B) located between portion 250A of gate 250 and structure 820 and electrically separating structure 820 from portion 250A of gate 250.

Dielectric portions 922A and 922B can have the same dielectric material. Dielectric portions 922A and 922B can include charge trapping materials that can be different from the dielectric materials of dielectric structures 822A and 822B. For example, dielectric portions 922A and 922B can include silicon nitride ($Si_3N_4$) and dielectric structures 822A and 822B can include a material different from silicon nitride. In another example, dielectric portions 922A and 922B can include aluminum oxide ($Al_2O_3$) and dielectric structures 822A and 822B can include a material different from aluminum oxide. In another example, dielectric portions 922A and 922B include a material that contains hafnium (e.g., hafnium oxide ($HfO_2$) or hafnium silicate ($HfSiO_2$)) and dielectric structures 822A and 822B can include a material different from the material that contains hafnium.

As described above with reference to FIG. 5. FIG. 6, and FIG. 7, memory device 200 can perform a calibration operation to adjust (e.g., to change) the value of the threshold voltage of transistor T as part of repairing failed memory cells. Memory device 200' can have a similar or the same calibration operation. For example, in FIG. 9A, FIG. 9B, and FIG. 9C, dielectric portions 922A and 922B can be configured (e.g., by selecting appropriate dielectric materials) to trap charge (e.g., electrons). As described above, during a repair stage of a calibration operation, gate 250 of transistor T (part of a respective access line) can be applied with a relatively higher voltage in comparison with voltages applied to gate 250 of transistor T during a read or write operation. In FIG. 9A, FIG. 9B, and FIG. 9C, the higher voltage applied at gate 250 (at portions 250A and 250B) of transistor T can induce a charge trapping event (e.g., induce stress to transistor T) where charge (e.g., electrons) can be trapped in dielectric portions 922A and 922B. The trapped charge can cause the value of the threshold voltage of transistor T to change (e.g., increase). Dielectric portions 922A and 922B can be selected such that transistor T can avoid damage from the charge trapping event. As described above, dielectric portions 922A and 922B can include an oxide material (e.g., aluminum oxide ($Al_2O_3$), or other high-k dielectric materials) that can be configured to allow transistor T to withstand the stress from the charge trapping event, so that the value of the threshold voltage of transistor T can be adjusted without causing damage (e.g., physical damage to the oxide material) to transistor T.

Figure 10A:
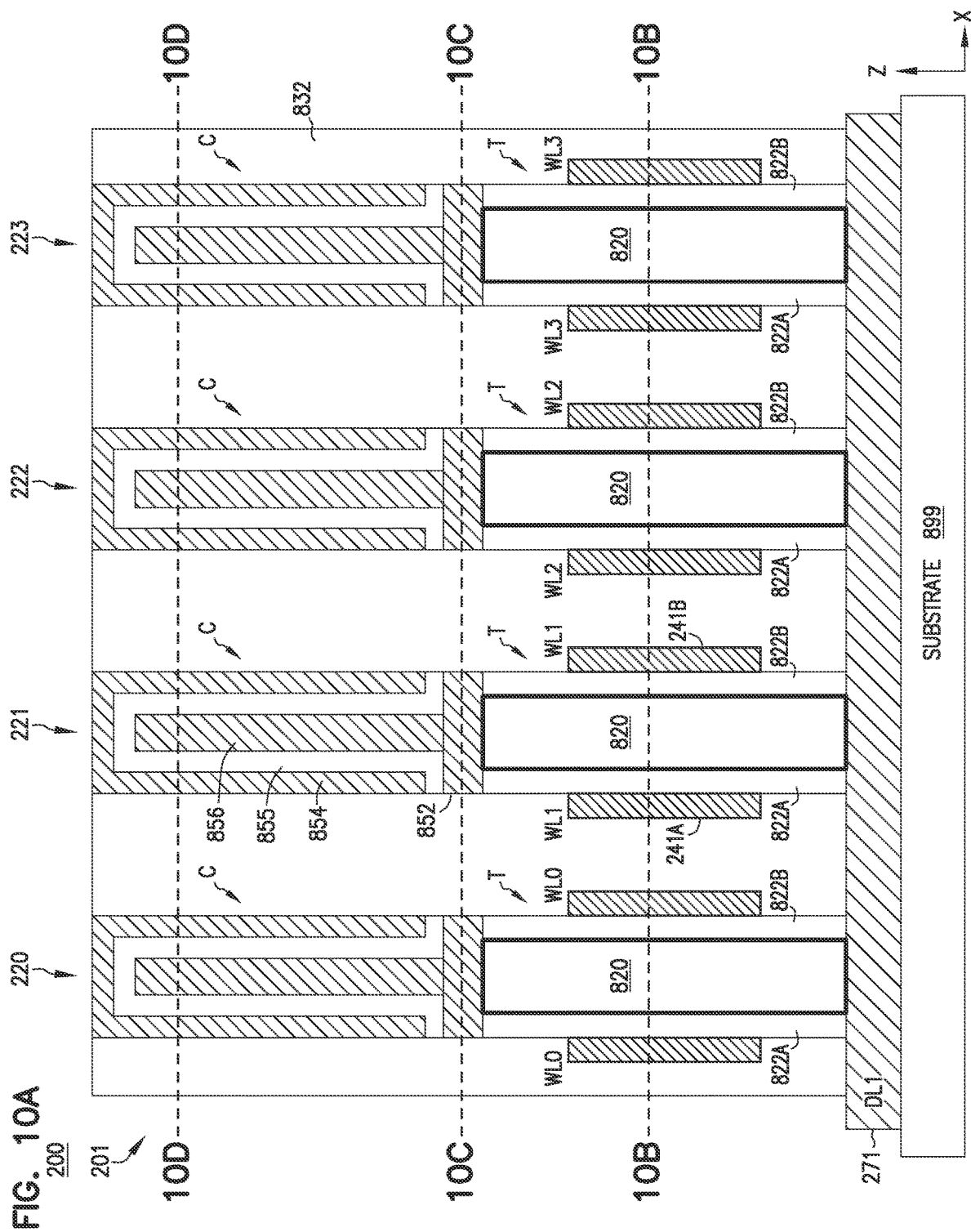
Figure 10B:
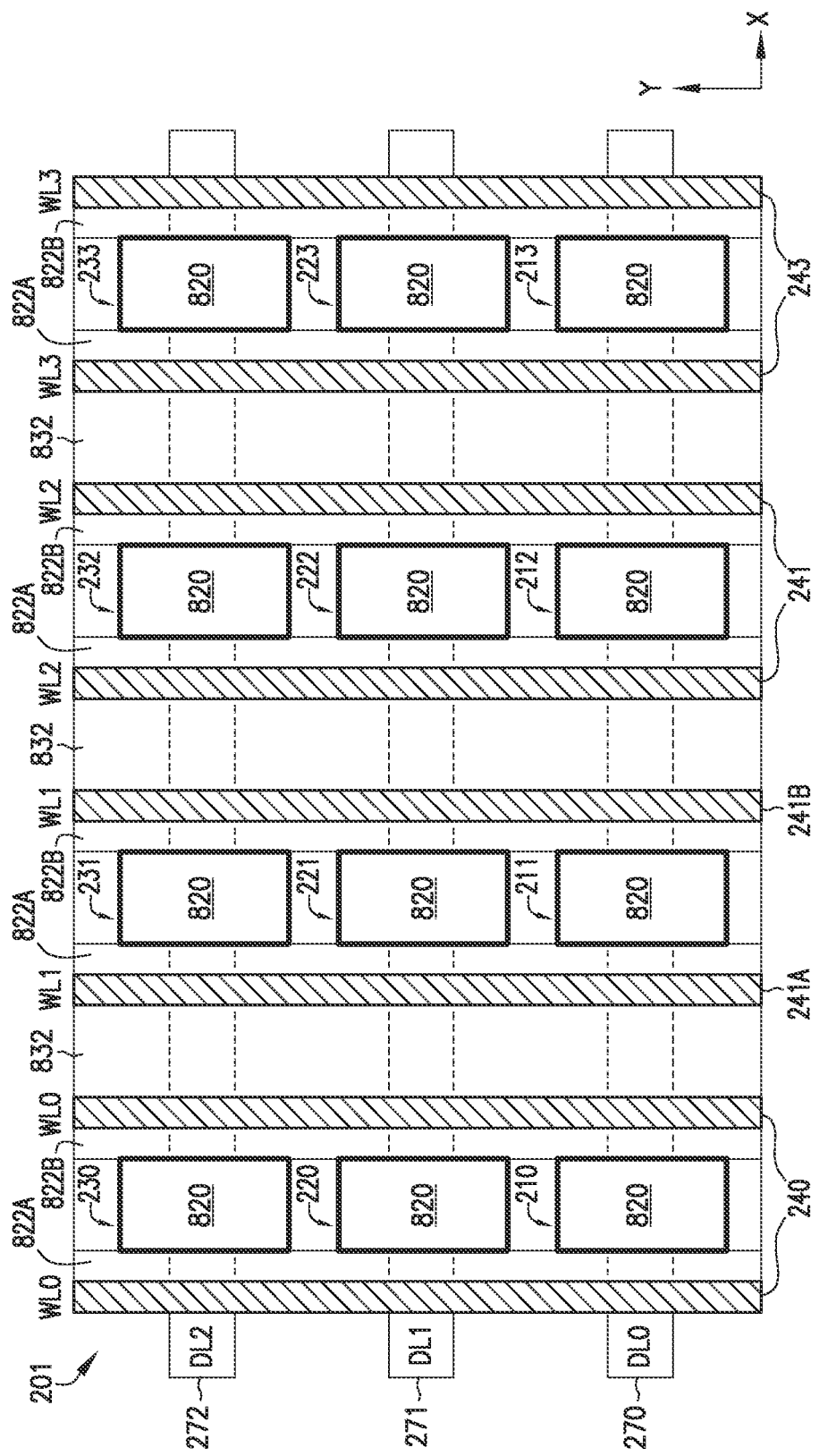

FIG. 10A, FIG. 10B, FIG. 10C, FIG. 10D, and FIG. 10E show different views of a structure of memory array 201 and access lines 240, 241, 242, and 243, and data lines 270, 271, and 272 of memory device 200, according to some embodiments described herein. FIG. 10A shows a side view (e.g., cross-section) of the structures of memory cells 220, 221, 222, and 223, data line 271, and access lines (not labeled) associated signals WL0, WL1, WL2, and WL3. Other views (e.g., side views and top views) of memory device 200 taken along lines 10B-1B, 10C-10C, and 10D-10D (in FIG. 10A) are shown in FIG. 10B. FIG. 10C, and FIG. 10D, respectively. Another view (e.g., side view) of memory device 200 taken along lines 10E-10E (in FIG. 10D) is shown in FIG. 10E.

The structures of the memory cells of memory array 201, access lines 240, 241, 242, and 243, and data lines 270, 271, and 272 shown in FIG. 10A through FIG. 10E are similar to or the same as respective structures of memory cell 221, access line 241, and data line 271 of FIG. 8A, FIG. 8B, and FIG. 8C. Thus, for simplicity, the descriptions of such structures are not repeated.

As shown in FIG. 10B and FIG. 10E, each of the access lines can have length in the Y-direction and can span across structure 820 of memory cells in a respective row. For example, as shown in FIG. 10A and FIG. 10E, portions 241A and 241B of access line 241 can span across respective sides of structure 820 of memory cells 211, 221, and 231. The spanning of access line 241 across structure 820 of memory cells 211, 221, and 231 allows access line 241 to control (e.g., to turn on or turn off) transistor T of memory cells 211, 221, and 231. Similarly, access line 240 (FIG. 10B) can have portions that span across respective sides of structure 820 of memory cells 210, 220, and 230 to allow control of transistor T of memory cells 210, 220, and 230. Access line 241 (FIG. 10B) can have portions that span across respective sides of structure 820 of memory cells 212, 222, and 232 to allow control of transistor T of memory cells 212, 222, and 232. Access line 243 (FIG. 10B) can have portions that span across respective sides of structure 820 of memory cells 213, 223, and 233 to allow control of transistor T of memory cells 213, 223, and 233.

As shown in FIG. 10B, each of data lines 270, 271, and 272 can have a length in the X-direction (which is perpendicular to the Y-direction) and can be located over substrate 899 and under the memory cells of memory device 200. For example, as shown in FIG. 10A and FIG. 10B, data line 271 can be located over substrate 899 and under memory cells 220, 221, 222, and 223 and coupled to (e.g., directly coupled to) structure 820 of memory cells 220, 221, 222, and 223. Other data lines (FIG. 10B) can have similar structures. As shown in FIG. 10B, data line 270 can be located over substrate 899 and under memory cells 210, 211, 212, and 213 and coupled to (e.g., directly coupled to) structure 820 of memory cells 210, 211, 212, and 213. As shown in FIG. 10B, data line 272 can be located over substrate 899 and under memory cells 230, 231, 232, and 233 and coupled to (e.g., directly coupled to) structure 820 of memory cells 230, 231, 232, and 233.

Figure 11B:
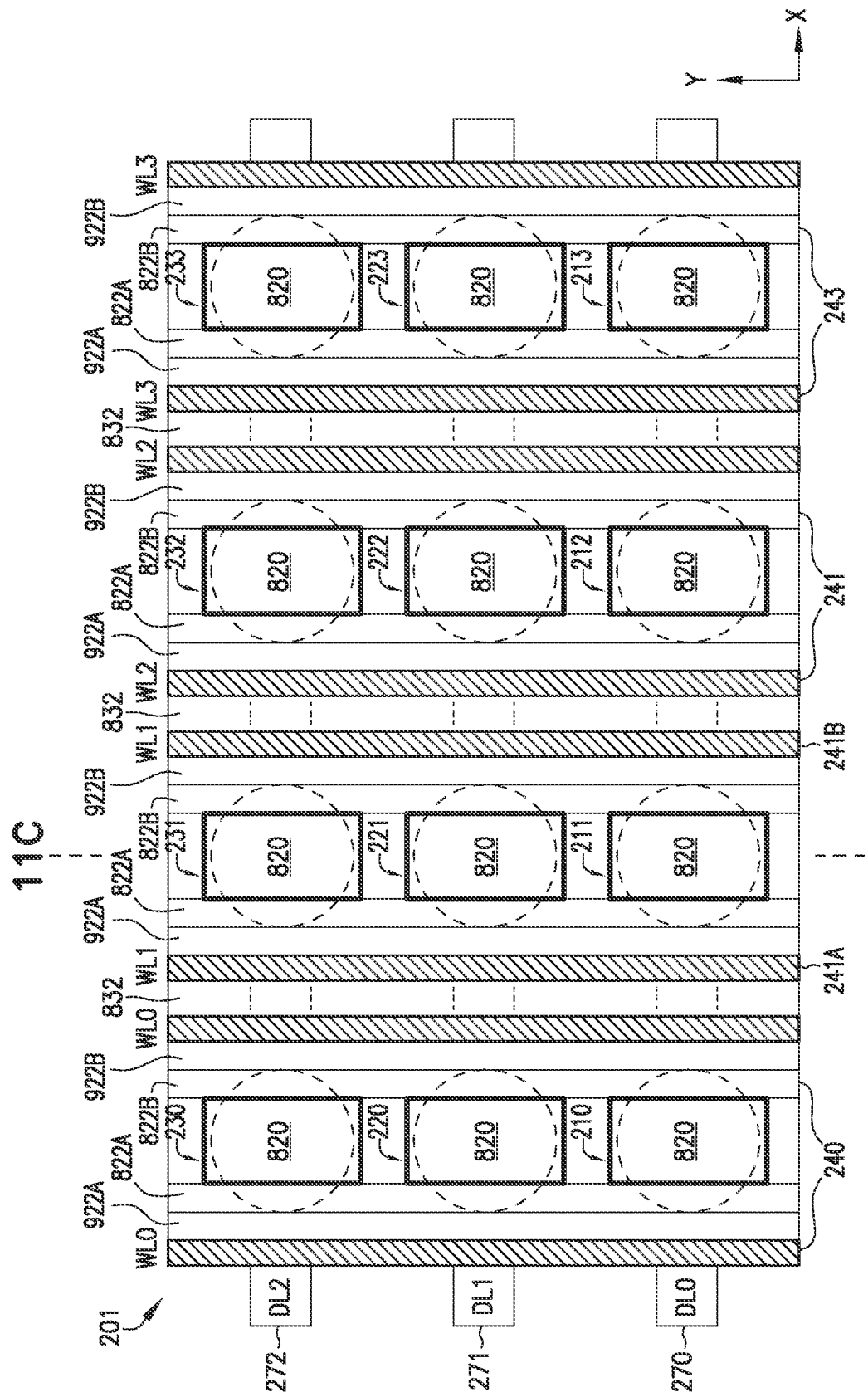

FIG. 11A. FIG. 11B, and FIG. 11C show different views of a structure of memory array 201, access lines 240, 241, 242, and 243, and data lines 270, 271, and 272 of memory device 200', according to some embodiments described herein. FIG. 11A shows a side view (e.g., cross-section) of the structures of memory cells 220, 221, 222, and 223, data line 271, and access lines (not labeled) associated signals WL0, WL1, WL2, and WL3. Other views (e.g., side view and top view) of memory device 200' taken along lines 11B-11B (in FIG. 11A) and 11C-11C (in FIG. 11B) are shown in FIG. 11B and FIG. 11C, respectively.

The structures of the memory cells of memory array 201, access lines 240, 241, 242, and 243, and data lines 270, 271, and 272 shown FIG. 11A, FIG. 11B, and FIG. 11C are similar to or the same as respective structures of memory cell 221, access line 241, and data line 271 of FIG. 9A, FIG. 9B, and FIG. 9C. Thus, for simplicity, the descriptions of such structures are not repeated.

The structures of the memory cells and the calibration operation of the memory device described herein (e.g., memory device 100, 200, or 200') can allow the memory device to have improvements and benefits over some conventional memory devices. For example, the structures of the memory cells (e.g., the structure of transistor T) of the described memory device (e.g., memory device 100, 200, or 200') can be relatively small. Such structures can be a challenge to control the threshold voltage of transistor T due to variation in the channel (e.g., variation in the material of structure 820) of transistor T and variation in the structure of the described memory cell. However, by including bit-level tunable structures (e.g., dielectric structures 822A and 822B and dielectric portions 922A and 922B) in each memory cell of the memory device in combination with on-die circuitry (e.g., calibration engine 150) to perform the calibration operation, the threshold voltage of transistor T of each memory cell can be controlled and adjusted. Yield can be improved by reducing variation in threshold voltage to reduce retention and a writeback failure in testing. ECC bit error rate in the memory device can be reduced by detecting and repairing failed memory cells.

The above description of memory devices 200 and 200' C with respect to FIG. 8A through FIG. 11C show an example where each access line (e.g., each word line), such as access line 241 in FIG. 8A through FIG. 9C, includes two portions 241A and 241B on opposite sides of structure (e.g., conductive channel) 820. Thus, as described above, gate 250 of transistor T can include portions 250A and 250B on opposite sides of structure 820 in which portions 250A and 250B can be part of portions 241A and 241B, respectively. However, in an alternative structure, one of portions 241A and 241B can be omitted (not formed in the memory device), such that each access line (e.g., access line 241) can include only one portion (e.g., either portion 241A or portion 241B) on one of the sides (a side in the X-direction) of structure 820. Accordingly, in the alternative structure, gate 250 of transistor T can include only one portion (e.g., either portion 250A or portion 250B) on one of the sides (side in the X-direction) of structure 820.

The above description of memory devices 200 and 200' C with respect to FIG. 8A through FIG. 11C show an example where capacitor C is located (e.g., formed) over transistor T. However, in an alternative structure, capacitor C can be located under transistor T. Further. FIG. 8A through FIG. 11C show an example where capacitor C is directly located over transistor T (e.g., vertically aligned with each other in the Z-direction). However, capacitor C and transistor T can be offset with each other (e.g., offset in the X-direction), such that capacitor C may not be vertically aligned with transistor T (e.g., may not be directly located over (or under) transistor T).

Figure 12:
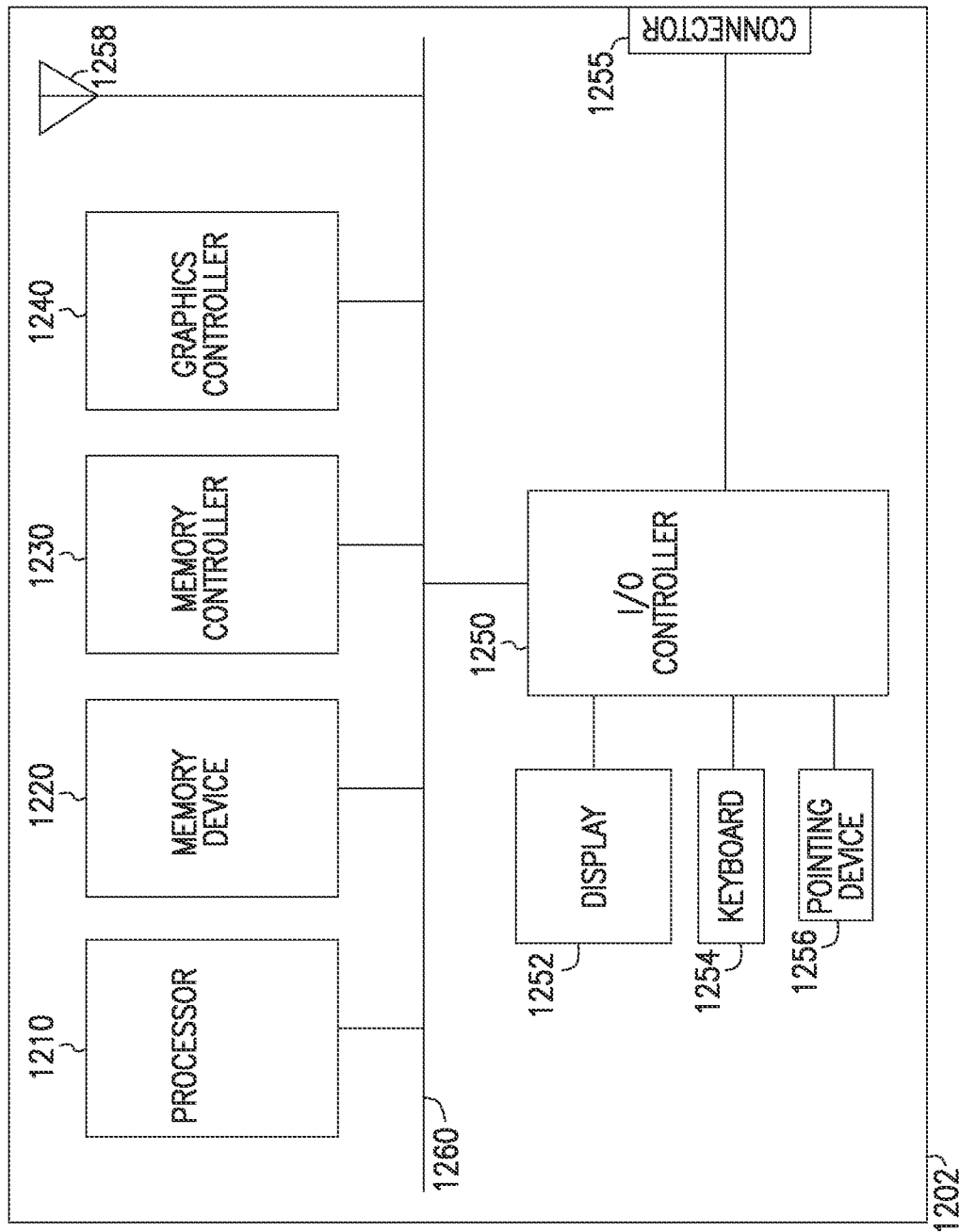
FIG. 12 shows an apparatus in the form of a system (e.g., electronic system), according to some embodiments described herein.

FIG. 12 shows an apparatus in the form of a system (e.g., electronic system) 1200, according to some embodiments described herein. System 1200 can include or be included in a computer, a tablet, a cellular telephone, or other electronic system. As shown in FIG. 12, system 1200 can include components located on a circuit board (e.g., printed circuit board (PCB)) 1202, including a processor 1210, a memory device 1220, a memory controller 1230, a graphics controller 1240, an I/O controller 1250, a display 1252, a keyboard 1254, a pointing device 1256, at least one antenna 1258, a connector 1255, and a bus 1260. Bus 1260 can include conductive lines (e.g., metal-based traces on a circuit board where the components of system 1200 are located).

In some arrangements, system 1200 does not have to include a display. Thus, display 1252 can be omitted from system 1200. In some arrangements, system 1200 does not have to include any antenna. Thus, antenna 1258 can be omitted from system 1200. In some arrangements, system 1200 does not have to include a connector. Thus, connector 1255 can be omitted from system 1200.

Processor 1210 can include a general-purpose processor, an application specific integrated circuit (ASIC), or other kinds of processors. Processor 1210 can include a CPU.

Memory device 1220 can include a DRAM device. For example, memory device 1220 can include memory device 100, memory device 200, or memory device 200'. Thus, memory device 1220 can include structures and operations (e.g., read, write, refresh, and calibration operations) that can be similar to those of memory device 100, including memory device 100, memory device 200, memory device 200' described above with reference FIG. 1 though FIG. 11D.

In an alternative arrangement of system 1200, memory device 1220 can include a static random access memory (SRAM) device, a flash memory device, a phase change memory device, or combination of these memory devices, or other types of memory devices. FIG. 12 shows an example where memory device 1220 is a stand-alone memory device separated from processor 1210. In an alternative arrangement, memory device 1220 and processor 1210 can be located on the same die. In such an alternative arrangement, memory device 1220 is an embedded memory in processor 1210, such as embedded DRAM (eDRAM), embedded SRAM (eSRAM), embedded flash memory, or another type of embedded memory.

Display 1252 can include a liquid crystal display (LCD), a touchscreen (e.g., capacitive or resistive touchscreen), or another type of display. Pointing device 1256 can include a mouse, a stylus, or another type of pointing device.

I/O controller 1250 can include a communication module for wired or wireless communication (e.g., communication through one or more antenna 1258). Such wireless communication may include communication in accordance with WiFi communication technique, Long Term Evolution Advanced (LTE-A) communication technique, or other communication techniques.

I/O controller 1250 can also include a module to allow system 1200 to communicate with other devices or systems in accordance with one or more of the following standards or specifications (e.g., I/O standards or specifications), including Universal Serial Bus (USB), DisplayPort (DP), High-Definition Multimedia Interface (HDMI). Thunderbolt. Peripheral Component Interconnect Express (PCIe), Ethernet, and other specifications.

Connector 1255 can be structured (e.g., can include terminals, such as pins) to allow system 1200 to be coupled to an external device (or system)). This may allow system 1200 to communicate (e.g., exchange information) with such a device (or system) through connector 1255. Connector 1255 and at least a portion of bus 1260 can include conductive lines that conform with at least one of USB, DP, HDMI, Thunderbolt, PCIe, Ethernet, and other specifications.

FIG. 12 shows the components of system 1200 arranged separately from each other as an example. For example, each of processor 1210, memory device 1220, memory controller 1230, graphics controller 1240, and I/O controller 1250 can be located on a separate IC (e.g., semiconductor die or an IC chip). In some arrangements, two or more components (e.g., processor 1210, memory device 1220, graphics controller 1240, and I/O controller 1250) of system 1200 can be located on the same die (e.g., same IC chip) that can be part of a system on chip, a system in a package, or other electronic devices or systems. For example, in an alternative arrangement, memory device 1220 and processor 1210 can be located on the same die or the same package (e.g., same IC package).

The illustrations of apparatuses (e.g., memory devices 100, 200, and 200' and system 1200) and methods (e.g., method 700 and operations of memory devices 100, 200, and 200' and system 1200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 200') or a system (e.g., an electronic item that can include any of memory devices 100, 200, and 200').

Any of the components described above with reference to FIG. 1 through FIG. 12 can be implemented in a number of ways, including simulation via software. Thus, apparatuses (e.g., memory devices 100, 200, and 200' and system 1200) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, and 200' and system 1200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group. Audio Layer 3) players), vehicles, medical devices (e.g., heart monitor, blood pressure monitor, etc.), set top boxes, an internet of thing (IoT) device, and others.

The embodiments described above with reference to FIG. 1 through FIG. 12 include apparatuses and methods using the apparatuses. One of the embodiments includes a capacitor, a transistor coupled to the capacitor, the transistor and the capacitor included in a memory cell; the transistor including a channel structure, a gate including a portion located on a side of the channel structure, and a dielectric structure between the channel structure and the gate; and on-die circuitry configured to selectively apply a stress condition to the transistor to tune a threshold voltage of the transistor. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A. B, and C are listed, then the phrase "at least one of A, B and C" means A only; B only; C only; A and B (excluding C); A and C (excluding B); B and C (excluding A); or all of A, B. and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A. B. and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a capacitor;
a transistor coupled to the capacitor, the transistor and the capacitor included in a memory cell, the transistor including a channel structure, a gate including a portion located on a side of the channel structure, and a dielectric structure including a first dielectric portion and a second dielectric portion adjacent the first dielectric portion, wherein both of the first and second dielectric portions are between the channel structure and the gate, wherein a direction between the channel structure and the gate through first and second dielectric portions is perpendicular to a direction between the channel structure and the capacitor; and
on-die circuitry configured to selectively apply a stress condition to the transistor to tune a threshold voltage of the transistor.

2. The apparatus of claim 1, wherein the on-die circuitry includes a built-in self-test (BIST) to detect whether the threshold voltage of the transistor is outside a particular range.

3. The apparatus of claim 1, wherein the dielectric structure includes a first dielectric portion and a second dielectric portion, the first dielectric portion and the second dielectric portion having different dielectric materials.

4. The apparatus of claim 3, wherein the second dielectric portion has a dielectric constant greater than a dielectric constant of silicon dioxide.

5. The apparatus of claim 3, wherein the second dielectric portion includes silicon nitride.

6. The apparatus of claim 3, wherein the second dielectric portion includes a material containing aluminum dioxide.

7. The apparatus of claim 3, wherein the second dielectric portion includes a material containing hafnium.

8. The apparatus of claim 1, wherein:
the first dielectric portion includes a first side contacting the channel structure, and a second side contacting the gate and the second dielectric portion; and
part of the second dielectric portion is located between the first dielectric portion and the gate and contacting the first dielectric portion and the gate.

9. The apparatus of claim 1, wherein the channel structure includes semiconducting oxide materials.

10. The apparatus of claim 1, wherein the dielectric structure is a first dielectric structure, the portion of the gate is a first portion of the gate, the side of the channel structure is a first side, and wherein:
the transistor further includes a second dielectric structure located between a second portion of the gate and a second side of the channel structure.

11. The apparatus of claim 10, wherein:
the first dielectric structure includes multiple portions; and
the second dielectric structure includes multiple portions.

12. The apparatus of claim 1, wherein the capacitor includes an electrode located over and coupled to the channel structure of the transistor.

13. The apparatus of claim 12, wherein the capacitor includes an additional electrode located over the channel structure of the transistor.

14. The apparatus of claim 1, further comprising a data line located under the memory cell and coupled to the channel structure of the transistor.

15. An apparatus comprising:
a memory array including memory cells, each of the memory cells including a transistor and a capacitor coupled to the transistor, the transistor including:
a channel structure;
a gate including a first portion and a second portion, the first portion located on a first side of the channel structure, and the second portion located on a second side of the channel structure;
a first dielectric structure including a first dielectric portion and a second dielectric portion located between the first portion of the gate and the channel structure, wherein a direction between the channel structure and the first portion of the gate through first and second dielectric portions is perpendicular to a direction between the channel structure and the capacitor; and
a second dielectric structure including a first additional dielectric portion and a second additional dielectric portion located between the second portion of the gate and the channel structure, wherein a direction between the channel structure and the second portion of the gate through first and second additional dielectric portions is perpendicular to a direction between the channel structure and the capacitor; and a memory control unit including circuitry, the memory control unit configured to perform operations comprising:

detecting whether a threshold voltage of the transistor of a memory cell among the memory cells is outside a particular range; and adjusting the threshold voltage of the transistor of a memory cell among the memory cells responsive to the detecting whether the threshold voltage of the transistor is outside the particular range.

16. The apparatus of claim 15, wherein the adjusting includes increasing the threshold voltage of the transistor.

17. The apparatus of claim 15, wherein:
the first and second dielectric portions have different dielectric materials; and
the first and second additional dielectric portions have different dielectric materials.

18. The apparatus of claim 17, wherein the second dielectric portion and the second additional dielectric portion have a dielectric constant greater than a dielectric constant of silicon dioxide.

* * * * *